(12) United States Patent
Shimizu et al.

(10) Patent No.: US 7,696,916 B2
(45) Date of Patent: Apr. 13, 2010

(54) PARALLEL TYPE ANALOG-TO-DIGITAL CONVERSION CIRCUIT, SAMPLING CIRCUIT AND COMPARISON AMPLIFICATION CIRCUIT

(75) Inventors: Yasuhide Shimizu, Nagasaki (JP);
Shigemitsu Murayama, Nagasaki (JP);
Kohei Kudo, Nagasaki (JP); Hiroaki Yatsuda, Nagasaki (JP)

(73) Assignee: Sony Corporation, Tokyo (JP)

( * ) Notice: Subject to any disclaimer, the term of this patent is extended or adjusted under 35 U.S.C. 154(b) by 48 days.

(21) Appl. No.: 12/230,285

(22) Filed: Aug. 27, 2008

(65) Prior Publication Data
US 2009/0073020 A1    Mar. 19, 2009

(30) Foreign Application Priority Data
Sep. 13, 2007    (JP)    ............................. 2007-238459
Feb. 2, 2008    (JP)    ............................. 2008-023398

(51) Int. Cl.
*H03M 1/36*    (2006.01)
(52) U.S. Cl. ........................ 341/159; 341/118; 341/120; 341/155; 341/172
(58) Field of Classification Search ................. 341/118, 341/120, 155, 158, 159, 172
See application file for complete search history.

(56) References Cited

U.S. PATENT DOCUMENTS

| | | | | |
|---|---|---|---|---|
| 4,395,732 | A * | 7/1983 | Upton | 348/27 |
| 4,857,931 | A * | 8/1989 | Gulczynski | 341/156 |
| 4,924,225 | A * | 5/1990 | Dingwall et al. | 341/118 |
| 5,363,055 | A * | 11/1994 | Ribner | 330/9 |
| 5,465,093 | A * | 11/1995 | Kusumoto et al. | 341/122 |
| 6,288,665 | B1 * | 9/2001 | Tsukamoto et al. | 341/155 |
| 6,459,078 | B1 * | 10/2002 | Fowler | 250/214 A |
| 6,459,394 | B1 * | 10/2002 | Nadi et al. | 341/120 |
| 6,710,734 | B2 * | 3/2004 | Ono et al. | 341/159 |
| 6,788,240 | B2 * | 9/2004 | Reyneri et al. | 341/159 |
| 7,557,746 | B1 * | 7/2009 | Waltari | 341/158 |
| 2003/0011497 | A1 * | 1/2003 | Kuo et al. | 341/118 |
| 2003/0169196 | A1 * | 9/2003 | Ono et al. | 341/159 |

* cited by examiner

*Primary Examiner*—Linh V Nguyen
(74) *Attorney, Agent, or Firm*—Rader, Fishman & Grauer PLLC

(57) ABSTRACT

A parallel type analog-to-digital conversion circuit, including a reference signal generating portion and a comparison amplification portion, the comparison amplification portion including a plurality of amplifiers, input resetting switches, first sampling capacitors, second sampling capacitors, first sampling switches, and second sampling switches.

8 Claims, 21 Drawing Sheets

FIRST PHASE

SECOND PHASE

F I G . 7
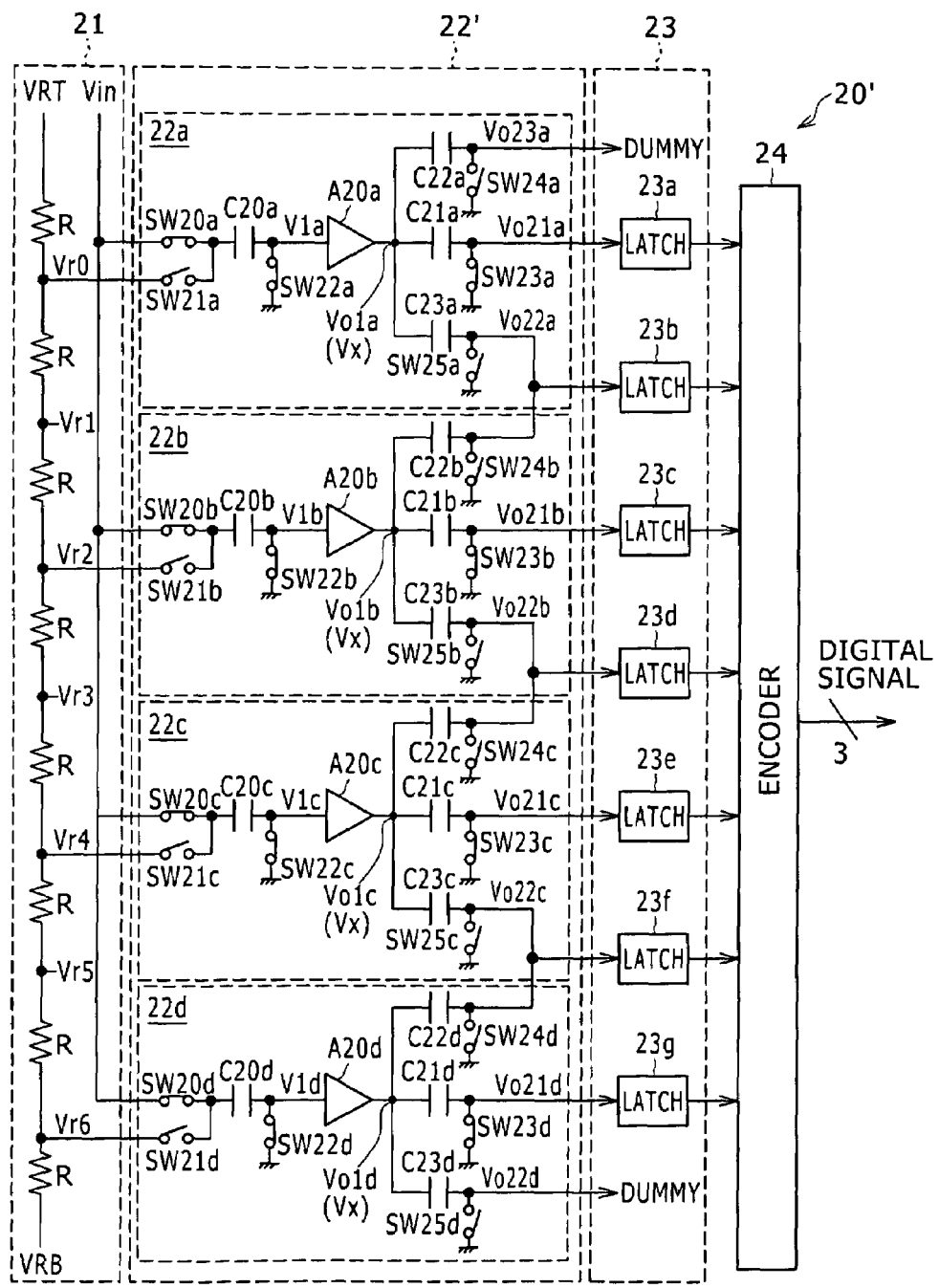

PARALLEL TYPE ANALOG-TO-DIGITAL CONVERSION CIRCUIT, SAMPLING CIRCUIT AND COMPARISON AMPLIFICATION CIRCUIT

CROSS REFERENCES TO RELATED APPLICATIONS

The present invention contains subject matter related to Japanese Patent Application JP 2008-023398 filed in the Japan Patent Office on Feb. 2, 2008, the entire contents of which being incorporated herein by reference.

BACKGROUND OF THE INVENTION

1. Field of the Invention

The present invention relates to a parallel type analog-to-digital conversion circuit, and a sampling circuit and a comparison amplification circuit each of which is used in the same.

2. Description of Related Art

Heretofore, there has been known a sampling circuit for canceling an offset voltage of an amplifier, amplifying an input signal and outputting the input signal thus amplified. FIG. 19A is a circuit diagram showing a configuration of this sampling circuit, and FIG. 19B is a timing chart explaining an internal operation of the sampling circuit.

A configuration of a sampling circuit 100 shown in FIG. 19A is described as follows. That is to say, an input signal Vin is inputted to an input side of an amplifier A100 through a switch SW100, and the input side of the amplifier A100 is adapted to be connected to the grounding potential (the ground in this case) through a switch SW101. Also, one terminal of a capacitor C100 is connected to an output terminal of the amplifier A100, and a switch SW102 is provided between the other terminal of the capacitor C100, and the grounding potential (ground).

The sampling circuit 100 operates in two phases of a reset phase and a signal output phase, and cancels an offset voltage of the amplifier A100 and amplifies the input signal Vin to the amplifier A100. That is to say, as shown in FIG. 19B, in the reset phase (for a time period from t1 to t2 and from t3 to t4), each of the switches SW101 and SW102 is held in an ON state to provide a state in which no input voltage Vin is inputted to the amplifier A100. In this case, the capacitor C100 is charged with the electric charges based on the offset voltage of the amplifier A100, and thus the offset voltage of the amplifier A100 is sampled by the capacitor C100. After that, in the signal output phase (for a time period from t2 to t3 and from t4 to t5), each of the switches SW101 and SW102 is held in an OFF state, and the switch SW100 is held in the ON state. In this case, the input signal Vin is inputted to the amplifier A100, an output signal Vo1 obtained by amplifying the input signal Vin in the amplifier A100 is outputted from the amplifier A100. Also, an output signal Vo2 obtained by subtracting the offset voltage of the amplifier A100 from the output signal Vo1 is outputted through the capacitor C100.

Here, a comparison amplification circuit with a track & hold (T/H) function is known as one of the circuits each of which is configured by using the principles of the sampling circuit 100. FIG. 20A is a circuit diagram showing a configuration of a comparison amplification circuit in the related art.

A configuration of the comparison amplification circuit 110 is described as follows. That is to say, as shown in FIG. 20A, an input signal Vin and a reference signal Vr are inputted to an amplifier A110 through switches SW110 and SW111, and a capacitor C110, and an input side of the amplifier A110 is adapted to be connected to the grounding potential (the ground in this case) through a switch SW112. On the other hand, one terminal of a capacitor C111 is connected to an output terminal of the amplifier A110, and a switch SW113 is provided between the other terminal of the capacitor C111 and the grounding potential (ground).

Also, as shown in FIG. 20B, the comparison amplification circuit 110 operates in two phases of a reset phase and a signal output phase.

In the reset phase, each of the switches SW110, SW112 and SW113 is held in an ON state, and the switch SW111 is held in an OFF state. At this time, the capacitor C110 as a capacitor for comparison is charged with the electric charges based on the input signal Vin, and thus the voltage of the input signal Vin is sampled by the capacitor C110. Moreover, a state is provided in which no input signal Vin is inputted to the amplifier A110. As a result, the capacitor C111 is charged with the electric charges based on the offset voltage of the amplifier A110, and thus the offset voltage is sampled by the capacitor C111.

In the signal output phase, each of the switches SW110, SW112 and SW113 is held in an OFF state, and the switch SW111 is held in an ON state. For this reason, an output signal Vo1 obtained by amplifying a voltage difference between the input signal Vin and the reference signal Vr in the amplifier A110 is outputted from the amplifier A110. Also, an output signal Vo2 obtained by subtracting the offset voltage of the amplifier A110 from the output signal Vo1 is outputted through the capacitor C111.

Such a comparison amplification circuit 110, for example, is used in a parallel type analog-to-digital conversion circuit 120 or the like. FIG. 21 is a circuit diagram showing a configuration of the parallel type analog-to-digital conversion circuit 120 in the related art.

Now, as shown in FIG. 21, the parallel type analog-to-digital conversion circuit 120 is generally configured by using comparison amplification circuits only for the resolution (for example, in the case of an n-bit analog-to-digital conversion circuit, ($2^n-1$) comparison amplification circuits). However, recently, a parallel type analog-to-digital conversion circuit using a resistive interpolation technique or a capacitive interpolation technique (hereinafter referred to as "an interpolation parallel type analog-to-digital conversion circuit) has attracted attention. This interpolation parallel type analog-to-digital conversion circuit, for example, is described in Japanese Patent Laid-Open No. 2003-100774.

Here, FIG. 22 shows a configuration of the interpolation parallel type analog-to-digital conversion circuit using the capacitive interpolation technique. A comparison amplification portion 132 using the capacitive interpolation technique is configured in the interpolation parallel type analog-to-digital conversion circuit shown in FIG. 22. It is noted that only a part of the comparison amplification portion 132 is illustrated herein for the sake of facilitating the understanding thereof.

The comparison amplification portion 132 generates voltage differences Vs1 and Vs2 between reference signals Vra and Vrb generated in a reference signal generating portion 131, and an input signal Vin in voltage difference generating portions 133a and 133b, respectively.

In a first amplifier group 134, the voltage differences Vs1 and Vs2 are amplified in a plurality of amplifiers A130a and A130b, respectively, and an intermediate voltage between the voltage differences Vs1 and Vs2 is amplified in an amplifier A130c.

A second amplifier group 135 includes a plurality of amplifiers A131a to A131c for amplifying voltages from the amplifiers A130a to A130c in the first amplifier group 134. In addition thereto, the second amplifier group 135 includes a plurality of amplifiers A131d and A131e for amplifying an intermediate voltage between output voltages from the amplifiers A130a and A130c, and an intermediate voltage between output voltages from the amplifiers A130b and A130c, respectively.

Each of output signals from the amplifiers A131a to A131e is outputted through one capacitors Ca and two capacitors Cb. Each of the output signals from the amplifiers A131a to A131e is outputted after each of the offset voltages of the amplifiers A131a to A131e is canceled through the capacitor Ca. In addition, the adjacent amplifiers (for example, the amplifiers A131a and A131d, and the amplifiers A131d and A131b) are each connected to each other through the two capacitors Cb. Thus, the output signals from the adjacent amplifiers are outputted after the offset voltages thereof are canceled and composed with each other. At this time, the capacitance value of the capacitor Cb is made half that of the capacitor Ca, which results in that the intermediate voltage between the output voltages from the amplifiers A131a and A131c, the intermediate voltage between the output voltages from the amplifiers A131b and A131e, and the intermediate voltage between the output voltages from the amplifiers A131e and A131c are each outputted through the capacitors Cb, respectively.

The output voltages through the capacitors Ca and Cb are successively latched in latch circuits in a latch portion in a subsequent stage. Also, encoding based on latch states in the latch circuits is carried out in an encoder, thereby obtaining a digital signal.

The number of amplifiers in the comparison amplification portion can be reduced in the interpolation parallel type analog-to-digital conversion circuit because of adoption of such a circuit configuration.

SUMMARY OF THE INVENTION

However, in the interpolation parallel type analog-to-digital conversion circuit using the capacitive interpolation technique described above, each of the amplifiers A131a to A131e must drive the two capacitors Cb for interpolation in addition to the capacitor Ca which should be essentially driven. That is to say, the load applied to each of the amplifiers doubles.

The load applied to each of the amplifiers A131a to A131e doubles as described above, which leads to that normally, a current in each of the amplifiers A131a to A131e needs to be doubled, and a chip width (W)/a chip length (L) ratio of each of output drive transistors in the amplifiers A131a to A131e also needs to be doubled.

Therefore, when the comparison amplification circuit described above is applied to the interpolation parallel type analog-to-digital conversion circuit using the capacitive interpolation technique, the number of amplifiers can be reduced in the interpolation parallel type analog-to-digital conversion circuit. However, the low power consumption and the small area can not be sufficiently realized in some cases. This applies to the interpolation parallel type analog-to-digital conversion circuit using the resistive interpolation technique, the current interpolation technique, or another interpolation technique as well as to the interpolation parallel type analog-to-digital conversion circuit using the capacitive interpolation technique.

The present invention has been made in order to solve the problems described above, and it is therefore desirable to provide a parallel type analog-to-digital conversion circuit in which low power consumption and a small area can be realized by reducing the number of amplifiers, and a comparison amplification circuit and a sampling circuit each of which is used in the same.

In order to attain the desire described above, according to an embodiment of the present invention, there is provided a parallel type analog-to-digital conversion circuit, includes a reference signal generating portion for generating a plurality of reference signals different in voltage from one another, and a comparison amplification portion for amplifying voltage differences between the plurality of reference signals generated by the reference signal generating portion, and an input signal, and outputting the voltage differences thus amplified. The comparison amplification portion includes a plurality of amplifiers, input resetting switches connected to input terminals of the plurality of amplifiers, respectively, and adapted to make an input signal to each of the plurality of amplifiers invalid, first sampling capacitors including one terminals connected to output terminals of the plurality of amplifiers, respectively, second sampling capacitors including one terminals connected to the output terminals of the plurality of amplifiers, respectively, and first sampling switches provided between the other terminals of the first sampling capacitors, and a portion including a predetermined potential. The comparison amplification portion further includes second sampling switches provided between the other terminals of the second sampling capacitors, and a portion including the predetermined potential, in which a control operation for holding each of the input resetting switches and the first sampling switches in an ON state for a given time period, and a control operation for holding each of the second sampling switches in an ON state for a given time period are carried out alternately, so that signals corresponding to the voltage differences between the input signal and the reference signals are outputted alternately through the first sampling capacitors and through the second sampling capacitors.

According to another embodiment of the present invention, a sampling circuit includes an amplifier for amplifying an input signal, an input resetting switch including one terminal connected to an input terminal of the amplifier and adapted to make the input signal to the amplifier invalid, and a plurality of capacitors including one terminals each being connected to an output terminal of the amplifier. The sampling circuit further includes a plurality of sampling switches provided between the other terminals of the plurality of capacitors, and portions each including a predetermined potential, respectively, in which after the input resetting switch and one or more sampling switches of the plurality of sampling switches are each held in an ON state for a given time period, the remaining one(s) of the plurality of sampling switches is(are) turned ON for a given time period, so that signals each corresponding to the input signal are outputted alternately through the other terminals of one or more capacitors of the plurality of capacitors, and the other terminal(s) of the remaining capacitor(s).

According to still another embodiment of the present invention, a comparison amplification circuit for outputting a signal corresponding to a voltage difference between an input signal and a reference signal, includes an amplifier, a capacitor for comparison including one terminal connected to an input terminal of the amplifier, and a switch for an input signal including one terminal connected to the other terminal of the capacitor for comparison for inputting the input signal to the amplifier. The comparison amplification circuit further includes a switch for a reference signal including one terminal connected to the other terminal of the capacitor for comparison for inputting the reference signal to the amplifier, an input resetting switch including one terminal connected to the input terminal of the amplifier for making the input signal to the amplifier invalid, and a plurality of sampling capacitors including one terminals each being connected to an output terminal of the amplifier. The comparison amplification circuit still further includes a plurality of sampling switches provided between the other terminals of the plurality of sampling capacitors, and portions each including a predetermined potential, respectively, in which each of the switch for an input signal and the input resetting switch, and the switch for a reference signal are alternately turned ON, each of one or more switches of the plurality of sampling switches, and the remaining switch(es) thereof are alternately turned ON synchronously with operations of each of the switch for an input signal and the input resetting switch, and the switch for a reference signal, and a signal corresponding to a voltage difference between the input signal and the reference signal is outputted alternately through each of one or more switches of the plurality of sampling switches, and the remaining switch(es) thereof.

BRIEF DESCRIPTION OF THE DRAWINGS

FIG. 7 is a circuit diagram of a capacitive interpolation parallel type analog-to-digital conversion circuit according to an embodiment of the present invention;

DETAILED DESCRIPTION OF THE PREFERRED EMBODIMENTS

Embodiments of a sampling circuit, a comparison amplification circuit, and a parallel type analog-to-digital conversion circuit including the sampling circuit and the comparison amplification circuit according to the present embodiment will be described in detail hereinafter with reference to the accompanying drawings. For the purpose of facilitating the understanding thereof, hereinafter, a description will be given in the order of the sampling circuit, the comparison amplification circuit, and the parallel type analog-to-digital conversion circuit with reference to the accompanying drawings. Each of the sampling circuit, the comparison amplification circuit, and the parallel type analog-to-digital conversion circuit according to the present embodiment may be either of a single input type or of a differential input type. However, the differential input type circuits are equivalent in equivalent circuit to the sampling circuit type circuits, respectively. Thus, hereinafter, for the purpose of facilitating the understanding thereof, a description will be given by giving single input type circuits (they may also be said as differential input type circuits in terms of the equivalent circuits) as examples.

Figure 1:
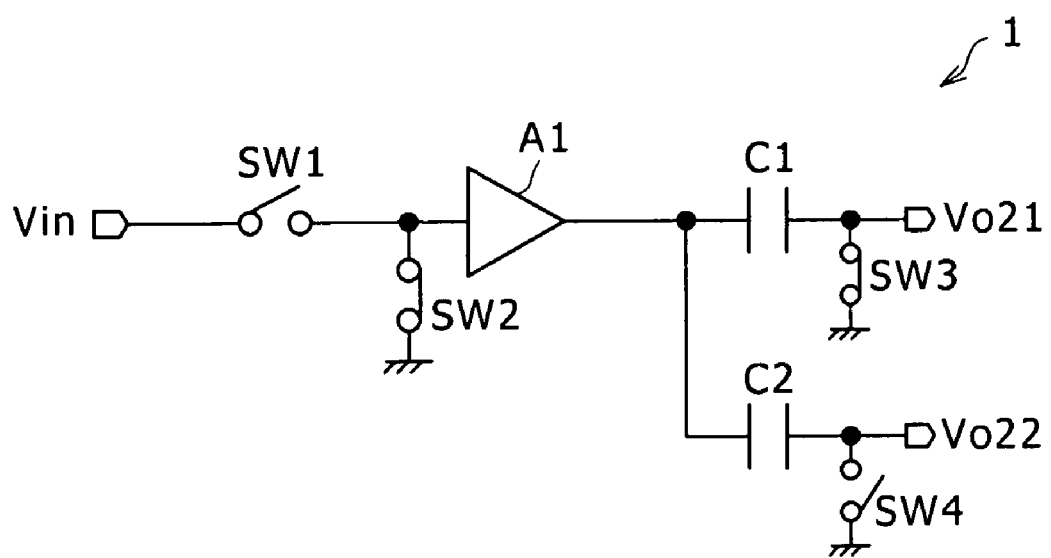
FIG. 1 is a circuit diagram showing a configuration of a sampling circuit according to an embodiment of the present invention.

Firstly, a sampling circuit according to an embodiment of the present invention will be described with reference to FIG. 1, and FIGS. 2A to 2C. FIG. 1 is a circuit diagram showing a configuration of a sampling circuit according to an embodiment of the present invention, and FIGS. 2A, 2B and 2C are respectively a circuit diagram of the sampling circuit in a first phase, a circuit diagram of the sampling circuit in a second phase, and a timing chart explaining an internal operation of the sampling circuit according to the embodiment of the present invention.

As shown in FIG. 1, the sampling circuit 1 of the embodiment includes an amplifier A1, a switch SW1 as a switch for an input signal, a switch SW2 as an input resetting switch, capacitors C1 and C2 as first and second sampling capacitors, and switches SW3 and SW4 as first and second sampling switches. In this case, the amplifier A1 amplifies an input signal Vin. The switch SW1 is provided between the input signal Vin and an input terminal of the amplifier A1, and the switch SW2 is provided between the input terminal of the amplifier A1 and a portion having a predetermined potential (the grounding potential in this case). The capacitors C1 and C2 have one terminals each of which is connected to an output terminal of the amplifier A1. Also, the switches SW3 and SW4 are provided between the other terminals of the capacitors C1 and C2, and portions each having a predetermined potential (the grounding potential in this case), respectively. It is noted that the switch SW2 as the input resetting switch is one for making an input signal to the amplifier A1 invalid, and thus in the case of the differential input type, it is preferably connected between the differential input terminals of the amplifier A1.

Figure 2A:
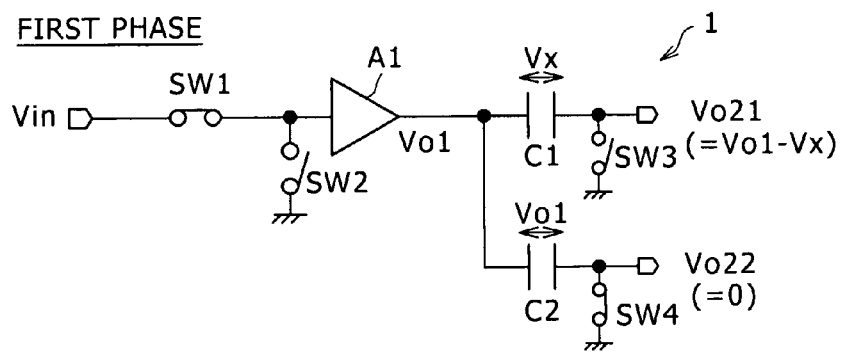
FIGS. 2A, 2B and 2C are respectively a circuit diagram of the sampling circuit in a first phase, a circuit diagram of the sampling circuit in a second phase, and a timing chart explaining an internal operation of the sampling circuit according to the embodiment of the present invention.
Figure 2B:
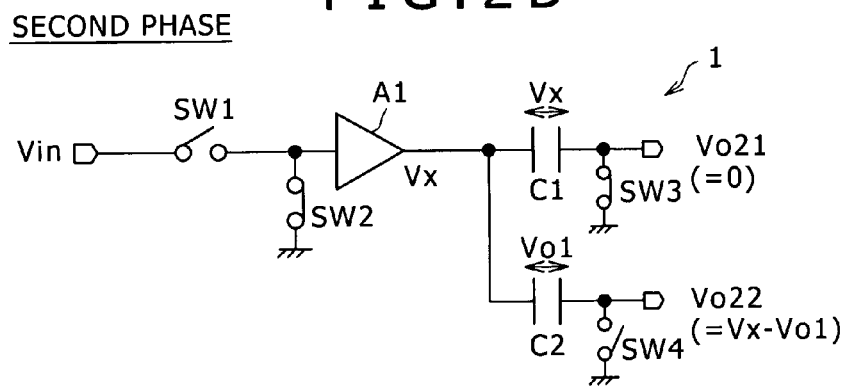
Figure 2C:
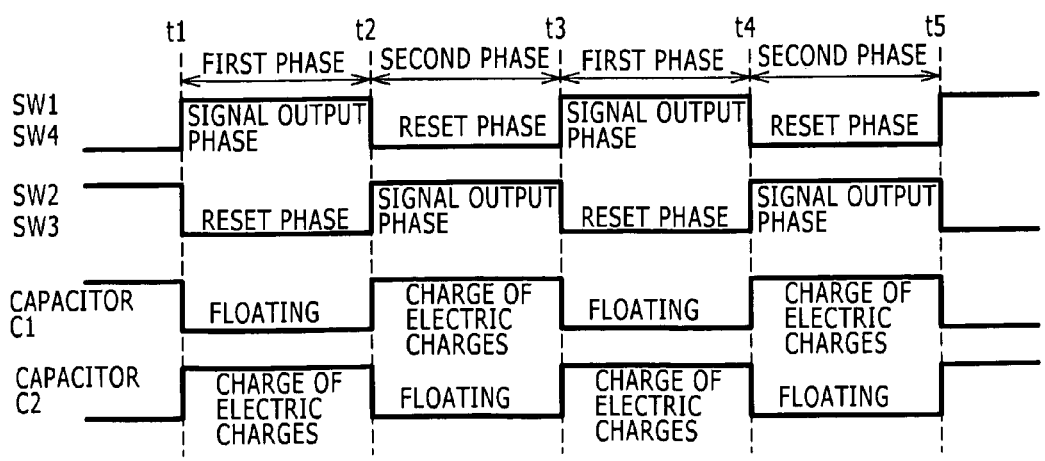

As shown in FIGS. 2A to 2C, the sampling circuit 1 repeatedly operates in a first phase (refer to FIG. 2A) and in a second phase (refer to FIG. 2B).

In the first phase (for a time period from t1 to t2 and t3 to t4), as shown in FIGS. 2A and 2C, the sampling circuit 1 holds each of the switches SW2 and SW3 in an OFF state, and holds each of the switches SW1 and SW4 in an ON state. The input signal Vin is inputted to the input terminal of the amplifier A1, and an output signal Vo1 obtained by amplifying the input signal Vin is outputted from the amplifier A1. In addition, in a second phase before the operation proceeds to the first phase, each of the switches SW2 and SW3 is held in the ON state, and thus an offset voltage Vx of the amplifier A1 is sampled by the capacitor C1. Thus, the switch SW3 is turned OFF, which results in that an output signal Vo21 (=Vo1−Vx) is outputted which is obtained by subtracting the offset voltage Vx, of the amplifier A1, sampled by the capacitor C1 from the output signal Vo1. On the other hand, since the switch SW4 is held in the ON state, the capacitor C2 is charged with the electric charges based on the output signal Vo1 outputted from the amplifier A1, and a voltage of the output signal Vo1 is sampled by the capacitor C2.

In a next second phase (for a time period from t2 to t3 and from t4 to t5), as shown in FIGS. 2B and 2C, the sampling circuit 1 holds each of the switches SW2 and SW3 in the ON state, and holds each of the switches SW1 and SW4 in the OFF state. Therefore, no input signal Vin is inputted to the input terminal of the amplifier A1, and thus the input terminal of the amplifier A1 is set at the grounding potential by the switch SW2. In addition, since the switch SW3 is held in the ON state, the capacitor C1 is charged with the electric charges based on the offset voltage Vx of the amplifier A1, and the offset voltage Vx of the amplifier A1 is sampled by the capacitor C1. On the other hand, the capacitor C2 is held in a floating state, and thus an output signal Vo22 (=Vx−Vo1) is outputted which is obtained by subtracting the output signal Vo1 sampled in the first phase by the comparator C2 from the offset voltage Vx of the amplifier A1.

In such a manner, in the amplifier A1 in this embodiment, after in the first phase, each of the switches SW1 and SW4 is held in the ON state for the given time period, in the second phase following the first phase, each of the switches Sw2 and SW3 is held in the ON state for the given time period. As a result, the output signals Vo21 and Vo22 corresponding to the input signal Vin in the first phase, and the output signals Vo21 and Vo22 corresponding to the input signal Vin in the second phase are alternately outputted through the capacitor C1 and the capacitor C2, respectively.

Therefore, with the sampling circuit 100 in the related art, the amplification of the input signal Vin made by canceling the offset voltage of the amplifier A100 can be carried out only in the signal output phase (corresponding to the first phase). However, with the sampling circuit 1 in this embodiment, the amplification of the input signal Vin can be carried out in the second phase as well other than the first phase corresponding to the signal output phase. Moreover, with regard to the load applied to the amplifier A1, when the capacitor C1 becomes the load, the capacitor C2 is held in the floating state, while when the capacitor C2 becomes the load, the capacitor C1 is held in the floating state. Therefore, when the capacitance value of the capacitor C2 is made identical to that of the capacitor C1, a current in the amplifier A1 needs not to be increased and thus a W(chip width)/L(chip length) ratio of an output drive transistor within the amplifier A1 can be made equal to that in the sampling circuit 100 in the related art. As a result, it is possible to suppress an increase in area in the sampling circuit.

Figure 3:
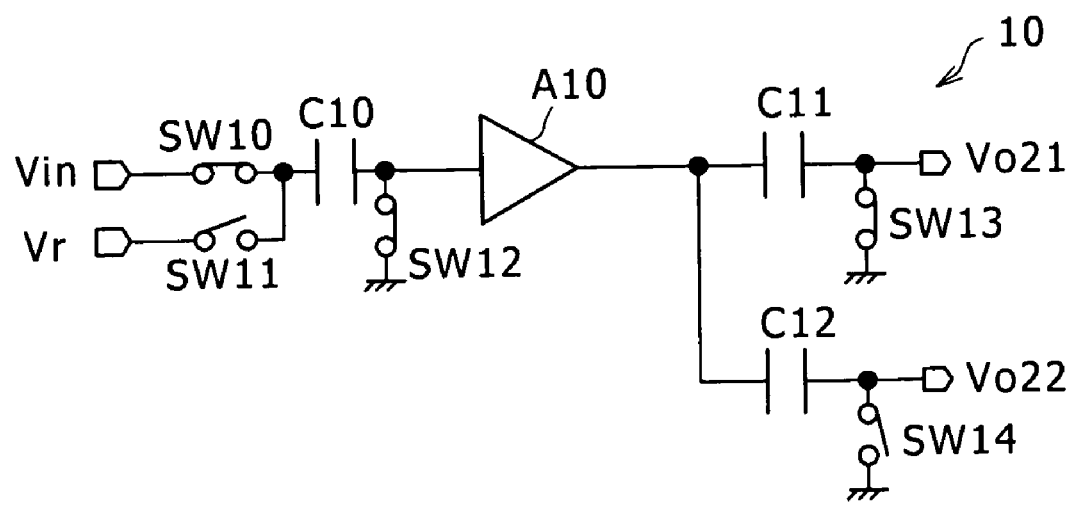
FIG. 3 is a circuit diagram showing a configuration of a comparison amplification circuit according to an embodiment of the present invention.

Next, a comparison amplifier circuit with a track & hole (T/H) function will be described as one, of circuits, configured by using the principles of the sampling circuit 1 with reference to corresponding ones of the accompanying drawings. FIG. 3 is a circuit diagram showing a configuration of a comparison amplification circuit according to an embodiment of the present invention, and FIGS. 4A, 4B and 4C are respectively a circuit diagram of the comparison amplification circuit in a first phase, a circuit diagram of the comparison amplification circuit in a second phase, and a timing chart explaining an internal operation of the comparison amplification circuit according to the embodiment of the present invention.

As shown in FIG. 3, the comparison amplification circuit 10 of this embodiment is one for outputting a signal corresponding to a voltage difference between an input signal Vin and a reference signal Vr. The comparison amplification circuit 10 includes an amplifier A10, a capacitor C10 as a capacitor for comparison, a switch SW10 as a switch for an input signal, a switch SW11 as a switch for a reference signal, a switch SW12 as an input resetting switch, a capacitor C11 as a first sampling capacitor and a capacitor C12 as a second sampling capacitor, and switches SW13 and SW14 as first and second sampling switches. In this case, the capacitor C10 has one terminal connected to an input terminal of the amplifier A10, and the switch SW10 has one terminal connected to the other terminal of the capacitor C10 and inputs the input signal Vin to the input terminal of the amplifier A10. The switch SW11 has one terminal connected to the other terminal of the capacitor C10, and inputs the reference signal Vr to the input terminal of the amplifier A10, and the switch SW12 is provided between the input terminal of the amplifier A10 and a portion having a predetermined potential (the grounding potential in this case). Also, the capacitors C11 and C12 have one terminals each of which is connected to an output terminal of the amplifier A10, and the switches SW13 and SW14 are provided between the other terminals of the capacitors C11 and C12, and portions each having the predetermined potential (the grounding potential in this case), respectively. It is noted that the switch SW12 as the input resetting switch is one for making an input signal to the amplifier A10 invalid, and in the case of the differential input type, is preferably connected between the differential input terminals of the amplifier A10.

Figure 4A:
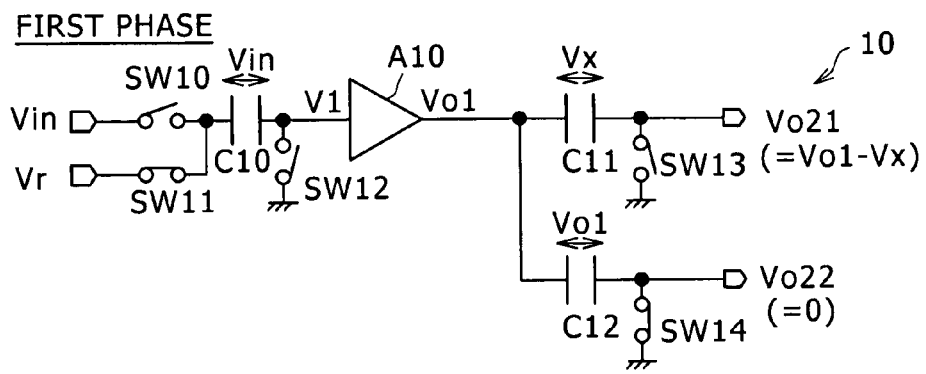
FIGS. 4A, 4B and 4C are respectively a circuit diagram of the comparison amplification circuit in a first phase, a circuit diagram of the comparison amplification circuit in a second phase, and a timing chart explaining an internal operation of the comparison amplification circuit according to the embodiment of the present invention.
Figure 4B:
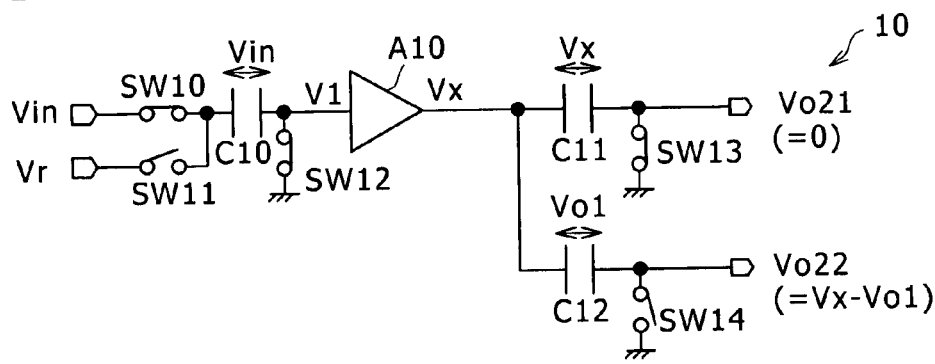
Figure 4C:
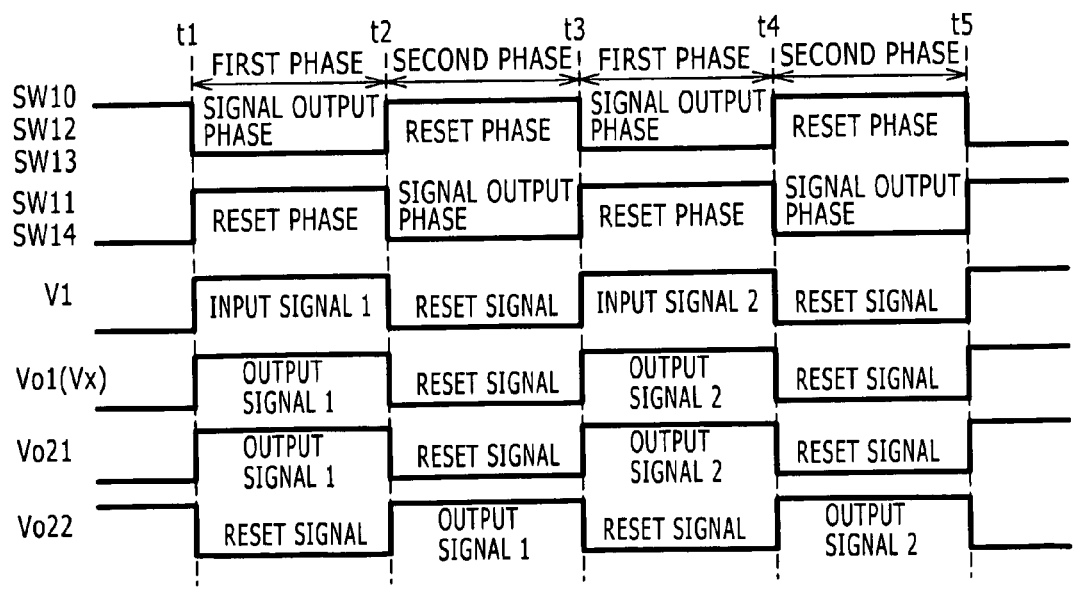

As shown in FIGS. 4A, 4B and 4C, the comparison amplification circuit 10 operates alternately in two phases of a first phase (refer to FIG. 4A) and a second phase (refer to FIG. 4B). It is noted that a signal corresponding to the voltage difference between the input signal Vin and the reference signal Vr in the first phase, and a signal corresponding to the voltage difference between the input signal Vin and the reference signal Vr in the second phase are alternately outputted through the capacitors C11 and C12, respectively, with the first and second phases as one cycle.

In the first phase (for a time period from t1 to t2 and from t3 to t4), as shown in FIGS. 4A and 4C, the comparison amplification circuit 10 holds each of the switches SW10, SW12 and SW13 in an OFF state, and holds each of the switches SW11 and SW14 in an ON state. Therefore, a voltage difference between the reference signal Vr and the input signal Vin is obtained by subtracting a voltage of the input signal Vin sampled by the capacitor C10 from the voltage of the reference signal Vr. The voltage difference thus obtained is then inputted to the input terminal of the amplifier A10 and is amplified therein. The resulting signal is outputted as an output signal Vo1 from the amplifier A10. In addition, in the second phase before the operation proceeds to the first phase, the comparison amplification circuit 10 holds each of the switches SW12 and SW13 in the ON state, and thus the offset voltage Vx of the amplifier A10 is sampled in the capacitor C11. The switch SW13 is turned OFF, which results in that an output signal Vo21 obtained by subtracting the offset voltage Vx of the amplifier A10 from the output signal Vo1 is outputted through the capacitor C11. On the other hand, since the switch SW14 is turned ON, the capacitor C12 is charged with the electric charges based on the output signal Vo1 outputted from the amplifier A10, and the voltage of the output signal Vo1 is sampled by the capacitor C12.

In the next second phase (for a time period from t2 to t3 and from t4 to t5), as shown in FIGS. 4B and 4C, the comparison amplification circuit 10 holds each of the switches SW10, SW12 and SW13 in an ON state, and holds each of the switches SW11 and SW14 in an OFF state. Therefore, no input signal Vin is inputted to the input terminal of the amplifier A10, and thus the input terminal of the amplifier A10 is set at the grounding potential through the switch SW12. In addition, since the switch SW10 is turned On, the voltage of the input signal Vin is sampled by the capacitor C10. Moreover, since the switch SW13 is turned ON, the capacitor C11 is charged with the electric charge based on the offset voltage Vx of the amplifier A10, and thus the offset voltage Vx of the amplifier A10 is sampled by the capacitor C11. On the other hand, since the capacitor C12 becomes the floating state, an output signal Vo22 (=Vx−Vo1) obtained by subtracting the voltage of the output signal Vo1 sampled in the first phase by the capacitor C12 from the offset voltage Vx of the amplifier A10 is outputted through the capacitor C12.

In such a manner, in the comparison amplification circuit 10 of this embodiment, after in the first phase, each of the switches SW11 and SW14 is held in the ON state for the given time period, in the second phase following the first phase, each of the switches SW10, SW12 and SW13 is held in the ON state for the given time period. As a result, in the first phase, the signal corresponding to the voltage difference between the reference signal Vr and the input signal Vin is outputted through the capacitor C11, and in the second phase, the offset voltage Vx is outputted from the amplifier A10. Thus, the output signals Vo21 and Vo22 corresponding to the voltage differences in the first and second phases, respectively, are alternately outputted through the capacitors C11 and C12, respectively.

Therefore, with the comparison amplification circuit 110 in the related art, the amplification of the voltage difference between the reference signal Vr and the input signal Vin made by canceling the offset voltage of the amplifier A110 can be carried out only in the signal output phase (corresponding to the first phase). However, with the comparison amplification circuit 10 of this embodiment, the amplification of the voltage difference between the reference signal Vr and the input signal Vin can be carried out in the second phase as well other than the first phase corresponding to the signal output phase. Moreover, with regard to the load applied to the amplifier A10, when the capacitor C11 becomes the load, the capacitor C12 is held in the floating state, while when the capacitor C2 becomes the load, the capacitor C1 is held in the floating state. Therefore, when the capacitance value of the capacitor C12 is made identical to that of the capacitor C11, a current in the amplifier A10 needs not to be increased and thus a W/L ratio of an output drive transistor within the amplifier A10 can be made equal to that in the amplifier A110 of the comparison amplification circuit 110 in the related art. As a result, it is possible to suppress an increase in area in the comparison amplification circuit.

Figure 5:
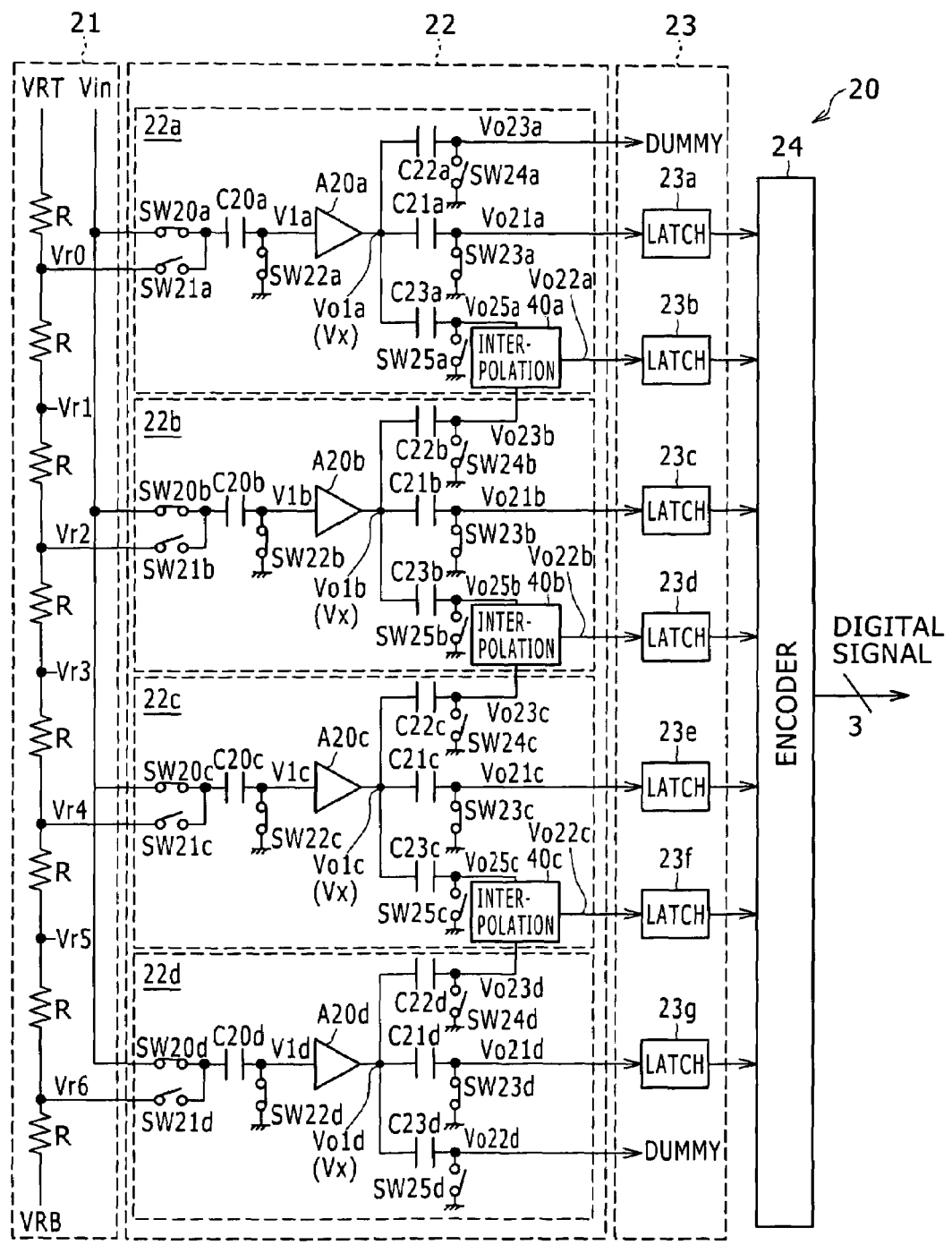
FIG. 5 is a circuit diagram of an interpolation parallel type analog-to-digital conversion circuit according to an embodiment of the present invention.

Next, FIG. 5 shows a configuration of an interpolation parallel type analog-to-digital conversion circuit, according to an embodiment of the present invention, which is configured with the comparison amplification circuit 10. Although for ease of explanation, the description will now be given with respect to a 3-bits interpolation parallel type analog-to-digital conversion circuit 20, the present embodiment can also apply to a 2-bits interpolation parallel type analog-to-digital conversion circuit or a 4-bit or more interpolation parallel type analog-to-digital conversion circuit similarly to the 3-bits interpolation parallel type analog-to-digital conversion circuit 20.

The 3-bits interpolation parallel type analog-to-digital conversion circuit 20 of this embodiment, as shown in FIG. 5, includes a reference signal generating portion 21, a comparison amplification portion 22, a latch portion 23, and an encoder 24. It is noted that although not illustrated in the figure, the 3-bits interpolation parallel type analog-to-digital conversion circuit 20 includes a sample-and-hold circuit and the like. In this case, the sample-and-hold circuit samples a voltage of an analog input signal, holds a sampled value of the voltage of the analog input signal for a given time period, and output the sampled value in the form of the input signal Vin.

The reference signal generating portion 21 is composed of a plurality of resistors R for voltage division connected in series with one another. A voltage difference between a higher voltage VRT and a lower voltage VRB is equally divided through the plurality of resistors R for voltage division, thereby generating a plurality of reference signals Vr0 to Vr6 which are different in voltage from one another.

The comparison amplification portion 22 is composed of a plurality of comparison amplification circuits 22a to 22d each having the same configuration as that of the comparison amplification circuit 10 described above. The comparison amplification circuit 22a includes three capacitors of a capacitor C21a, a capacitor C22a and a capacitor C23a. The comparison amplification circuit 22b includes three capacitors of a capacitor C21b, a capacitor C22b and a capacitor C23b. The comparison amplification circuit 22c includes three capacitors of a capacitor C21c, a capacitor C22c and a capacitor C23c. Also, the comparison amplification circuit 22d includes three capacitors of a capacitor C21d, a capacitor C22*d* and a capacitor C23*d*. A signal corresponding to a voltage difference between the input signal Vin and the reference signal Vr0 is outputted through the capacitor C21*a* of the capacitors C21*a* to C21*d*. Likewise, a signal corresponding to a voltage difference between the input voltage Vin and the reference signal Vr2 is outputted through the capacitor C21*b*. A signal corresponding to a voltage difference between the input signal Vin and the reference signal Vr4 is outputted through the capacitor C21*c*. Also, a signal corresponding to a voltage difference between the input voltage Vin and the reference signal Vr6 is outputted through the capacitor C21*d*.

In addition, the capacitor C23*a* to C23*c* and the capacitors C22*b* to C22*d* in the adjacent comparison amplification circuits (the comparison amplification circuits 22*a* and 22*b*, 22*b* and 22*c*, and 22*c* and 22*d*) to which the reference signals close in voltage level difference to each other are inputted, respectively, are connected to interpolation circuits 40*a* to 40*c*, respectively. Also, output signals Vo22*a* to V22*c* are outputted which are obtained by performing the interpolation between the output signals Vo21*a* and Vo21*b*, between the output signals Vo21*b* and Vo21*c*, and between the output signals Vo21*c* and Vo21*d* in the interpolation circuits 40*a*, 40*b* and 40*c*. It is noted that the output signals Vo21*a* to Vo21*d* are outputted in the first phase, while the output signals Vo22*a* to Vo22*c* are outputted in the second phase.

The latch portion 23 is composed of latch circuits 23*a* to 23*g*. The latch circuits 23*a* to 23*g* compare the output signals Vo21*a*, Vo22*a*, Vo21*b*, Vo22*b*, Vo21*c*, Vo22*c*, and Vo21*d* with a predetermined threshold to latch therein these output signals. It is noted that latched comparators or the like are used as the latch circuits 23*a* to 23*g*.

The encoder 24 performs encoding based on the latch states in the latch circuits 23*a* to 23*g* to output a 3-bits digital signal. It is noted that the polarities of the output signal Vo21*a* to Vo21*d*, and the output signals Vo22*a* to Vo22*c* are inverted depending on the circuit configurations of the interpolation circuits 40*a* to 40*c* in some cases. In such cases, the encoder 24 recognizes the inversion of the latch states of the latch circuits 23*b*, 23*d* and 23*f* with respect to the latch states of the latch circuits 23*a*, 23*c*, 23*e* and 23*g*. It is noted that amplifiers may be disposed in a preceding stage of the latch circuits 23*a* to 23*g*, respectively, instead of recognizing the inversion in the encoder 24. In this case, inverting amplifies are used as the amplifiers disposed in the preceding stage of the latch circuits 23*b*, 23*d* and 23*f*. In addition, when the interpolation parallel type analog-to-digital conversion circuit 20 is not of the single input type, but of the differential input type, the polarity inversion is performed by inverting the polarities of the input signals to the differential amplifiers in the preceding stage of the latch circuits 23*b*, 23*d* and 23*f*. When there is the necessity for making the polarity of each of the output signals Vo21*a* to Vo21*d* and the polarity of each of the output signals Vo22*a* to Vo22*c* agree with each other in such a manner, any analog or digital polarity inversion may be available as long as these polarities can be finally made to agree with each other.

A description will now be given with respect to concrete configuration and operation of each of the comparison amplification circuits 22*a* to 22*d* in the interpolation parallel type analog-to-digital conversion circuit 20 configured in the manner as described above. It is noted that since the comparison amplification circuits 22*a* to 22*d* are identical in configuration and operation to one another, the configuration and operation of the comparison amplification circuit 22*a* will now be described herein as an example.

The comparison amplification circuit 22*a* includes an amplifier A20*a*, a capacitor C20*a* as a capacitor for comparison, a switch SW20*a* as a switch for an input signal, a switch SW21*a* as a switch for a reference signal, a switch SW22*a* as an input resetting switch, a capacitor C21*a* as a first sampling capacitor, two capacitors C22*a* and C23*a* as second sampling capacitors, a switch SW23*a* as a first sampling switch, and two switches SW24*a* and SW25*a* as second sampling switches. In this case, the capacitor C20*a* has one terminal connected to an input terminal of the amplifier A20*a*, the switch SW20*a* inputs the input signal Vin to the input terminal of the amplifier A20*a*, and the switch SW21*a* has one terminal connected to the other terminal of the capacitor C20*a* and inputs the reference signal Vr0 to the input terminal of the amplifier A20*a*. The switch SW22*a* is provided between the input terminal of the amplifier A20*a* and a portion having a predetermined potential (the grounding potential in this case), and the capacitor C21*a* has one terminal connected to an output terminal of the amplifier A20*a*. The two capacitors C22*a* and C23*a* have one terminals each being connected to the output terminal of the amplifier A20*a* and each of them has a capacitance value which is half that of the capacitor C21*a*, and the switch SW23*a* is provided between the other terminal of the capacitor C21*a* and a portion having the predetermined potential. Also, the two switches SW24*a* and SW25*a* are provided between the other terminal of the capacitor C22*a* and a portion having the predetermined potential, and between the other terminal of the capacitor C23*c* and a portion having the predetermined potential, respectively. It is noted that the switch 22*a* as the input resetting switch is one for making the input signal to the amplifier A20*a* invalid, and in the case of the differential input type, is preferably connected between the differential input terminals of the amplifier A20*a*.

Figure 6:
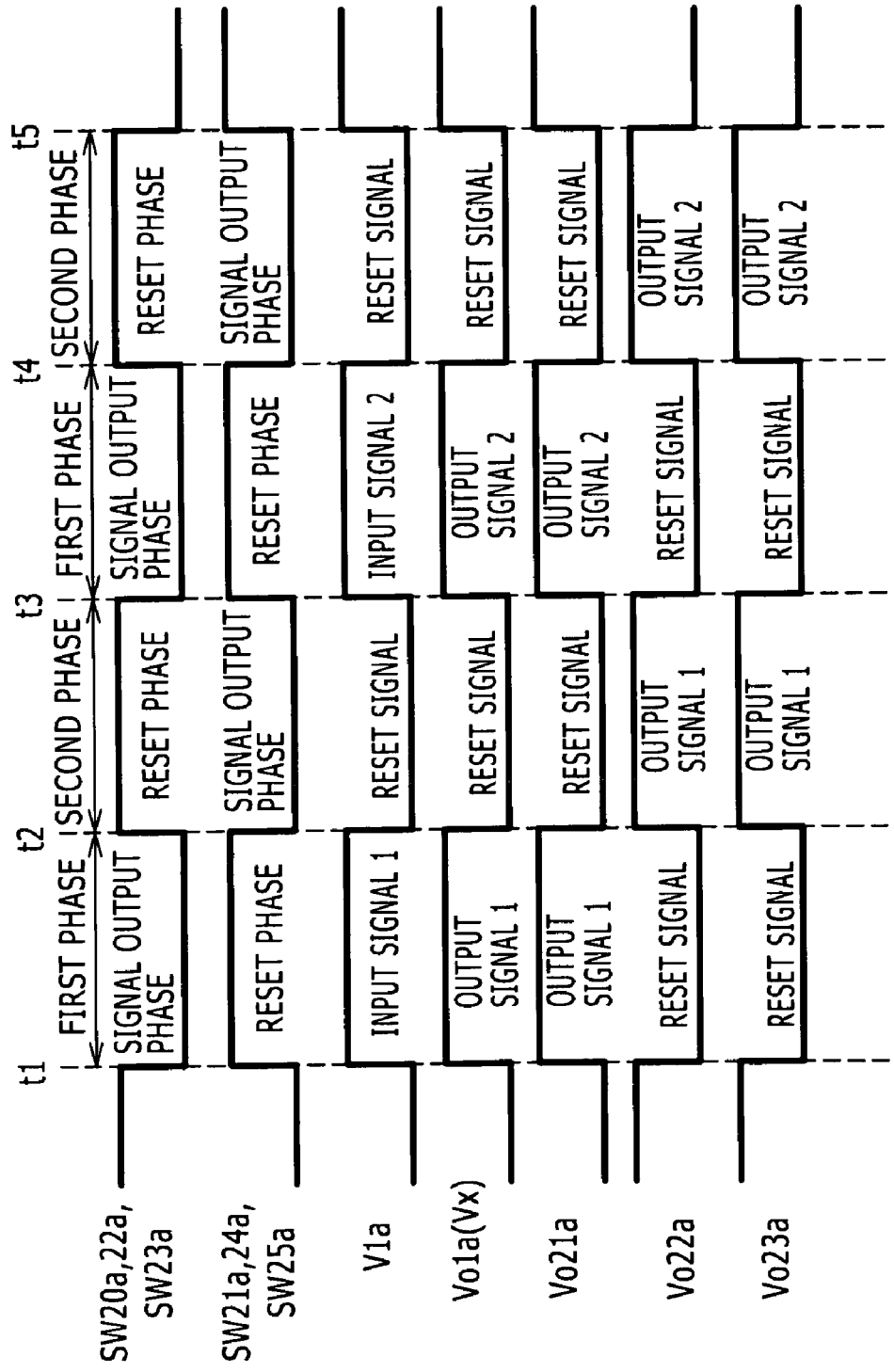
FIG. 6 is a timing chart explaining timings in an internal operation of the interpolation parallel type analog-to-digital conversion circuit according to the embodiment of the present invention.

Also, the comparison amplification circuit 22*a* outputs the output signal Vo21*a* corresponding to the voltage difference between the input signal Vin and the reference signal Vr0, and the like in the two phases of the first phase and the second phase. FIG. 6 is a timing chart explaining an internal operation of the interpolation parallel type analog-to-digital conversion circuit 20 of this embodiment.

In the first phase (for a time period from t1 to t2 and from t3 to t4), as shown in FIG. 6, the comparison interpolation circuit 22*a* holds each of the switches SW20*a*, SW22*a* and SW23*a* in an ON state, and holds each of the switches SW21*a*, SW24*a* and SW25*a* in the ON state. As a result, a voltage of the input signal Vin sampled by the capacitor C20*a* is subtracted from a voltage of the reference signal Vr0. The resulting voltage difference between the reference signal Vr0 and the input signal Vin is inputted to the amplifier A20*a* to be amplified therein. The signal thus amplified is outputted as the output signal Vo1*a* from the amplifier A20*a*. In addition, in the second phase before the operation proceeds to the first phase, the comparison interpolation circuit 22*a* holds each of the switches SW22*a* and SW23*a* in the ON state, and thus the offset voltage Vx of the amplifier A20*a* is sampled by the capacitor C21*a*. Therefore, the switch SW23*a* is held in the OFF state in the first phase, which results in that a voltage difference obtained by subtracting the offset voltage Vx of the amplifier A20*a* from the output signal Vo1 is outputted as the output signal Vo21*a* through the capacitor C21*a*. On the other hand, since each of the switches SW24*a* and SW25*a* is held in the ON state, each of the capacitors C22*a* and C23*a* is charged with the electric charges based on the output voltage Vo1*a* outputted from the amplifier A20*a*. Thus, the voltage of the output signal Vo1*a* is sampled by each of the capacitors C22*a* and C23*a*.

In the next second phase (for a time period from t2 to t3 and from t4 to t5), as shown in FIG. 6, the comparison interpolation circuit 22a holds each of the switches SW20a, SW22a and SW23a in an ON state, and holds each of the switches SW21a, SW24a and SW25a in the OFF state. As a result, the input terminal of the amplifier A20a is set at the grounding potential through the switch SW22a. In addition, since the switch SW20a is held in the ON state, the voltage of the input signal Vin is sampled by the capacitor C20a. Moreover, since the switch SW23a is held in the ON state, the capacitor C21a is charged with the electric charges based on the offset voltage Vx of the amplifier A20a, and the offset voltage Vx of the amplifier A20a is sampled by the capacitor C21a. On the other hand, since each of the capacitors C22a and C23a is held in a floating state, a voltage difference (=Vx−Vo1a) obtained by subtracting a voltage of the output signal Vo1 sampled by the capacitor C22a from the offset voltage Vx of the amplifier A20a, and a voltage difference (=Vx−Vo1a) obtained by subtracting the voltage of the output signal Vo1 sampled by the capacitor C23a from the offset voltage Vx of the amplifier A20a are outputted as the output signal Vo23a and the output signal Vo25a through the capacitors C22a and C23a, respectively. Also, the output signal Vo22 (={Vo25a+Vo23b}/2) having an intermediate level between the output signal Vo25a and the output signal Vo23b is generated by the interpolation 40a to be outputted.

Hereinafter, the input signals are successively inputted as the input signals Vin and processed with the first and second phases as one cycle similarly to the above case.

As has been described above, in the comparison amplification circuit 22a, after in the first phase, each of the switches SW21a, SW24a and SW25a is held in the ON state for the given time period, in the second phase, each of the switches SW20a, SW22a and SW23a is held in the ON state for the given time period. As a result, in the first phase, the output signal Vo21a corresponding to the voltage difference between the reference signal Vr0 and the input signal Vin is outputted from the amplifier A20a. Also, in the second phase, the signals each corresponding to the voltage difference between the reference signal Vr0 and the input signal Vin is outputted through the capacitors C22a and C23a, respectively.

Therefore, with the interpolation parallel type analog-to-digital conversion circuit in the related art, the amplification of the voltage difference between the reference signal Vr and the input signal Vin made by canceling the offset voltage Vx of the amplifier can be carried out only in the signal output phase. However, with the interpolation parallel type analog-to-digital conversion circuit of this embodiment, the amplification of the voltage difference between the reference signal Vr and the input signal Vin can be carried out in the second phase as well other than the first phase corresponding to the signal output phase.

Moreover, with regard to the loads applied to the amplifiers A20a to A20d in the comparison amplification circuits 22a to 22d, respectively, when each of the capacitors C21a to C21d becomes the-load, each of the capacitors C22a to C22d and C23a to C23d is held in the floating state. On the other hand, when each of the capacitors C22a to C22d and C23a to C23d becomes the load, each of the capacitors C21a to C21d becomes the load is held in the floating state.

Also, the capacitance value of each of the capacitors C22a to C22d and C23a to C23d is made half that of each of the capacitors C21a to C21d. As a result, currents in the amplifiers A20a to A20d need not to be increased, and thus a W/L ratio of an output drive transistor within each of the amplifiers A20a to A20d also needs not to be changed from that in the related art. As a result, in the interpolation parallel type analog-to-digital conversion circuit, the number of amplifiers can be reduced and thus the small area can be realized.

It is noted that the phase corresponding to the signal output phase may be set as the second phase instead of being set as the first phase. That is to say, after in the first phase, each of the switches SW20a, SW22a, SW24a and SW25a is held in the ON state for the given time period, in the second phase, each of the switches SW21a and SW23a is held in the ON state for the given time period. As a result, in the first phase, the signal corresponding to the voltage difference between the reference signal Vr0 and the input signal Vin is outputted from the amplifier A20a. Also, in the second phase, the signal corresponding to the voltage difference between the reference signal Vr0 and the input signal Vin is outputted through the capacitor C21a.

Here, a description will be given with respect to an interpolation parallel type analog-to-digital conversion circuit configured by using a capacitive interpolation technique as the interpolation technique with reference to FIG. 7. FIG. 7 is a circuit diagram showing a configuration of a capacitive interpolation parallel type analog-to-digital conversion circuit 20'.

As shown in FIG. 7, in the interpolation parallel type analog-to-digital conversion circuit 20' using the capacitive interpolation technique, capacitors C23a to C23c and capacitors C22b to C22d in the adjacent comparison amplification circuits (the comparison amplification circuits 22a and 22b, 22b and 22c, and 22c and 22d) to which the reference signals close in voltage level difference to each other are inputted, respectively, are connected to each other, respectively, thereby configuring the capacitive interpolation circuit. Also, output signals Vo22a to Vo22c are outputted which are obtained by performing the interpolation between the output signals Vo21a and Vo21b, between the output signal Vo21b and Vo21c, and between the output signals Vo21c and Vo21d. It is noted that since the capacitors C23a to C23c are connected to the capacitors C22b to C22d, respectively, the voltages of the output signals Vo22a to Vo22c are respectively composite voltages obtained by composing the output voltage signals of the capacitors C23a to C23c and the output voltage signals of the capacitors C22b to C22d with each other. As described above, with the capacitive interpolation, the small area can be realized because the capacitors C23a to C23c and the capacitors C22b to C22d just have to be connected to each other.

Figure 8:
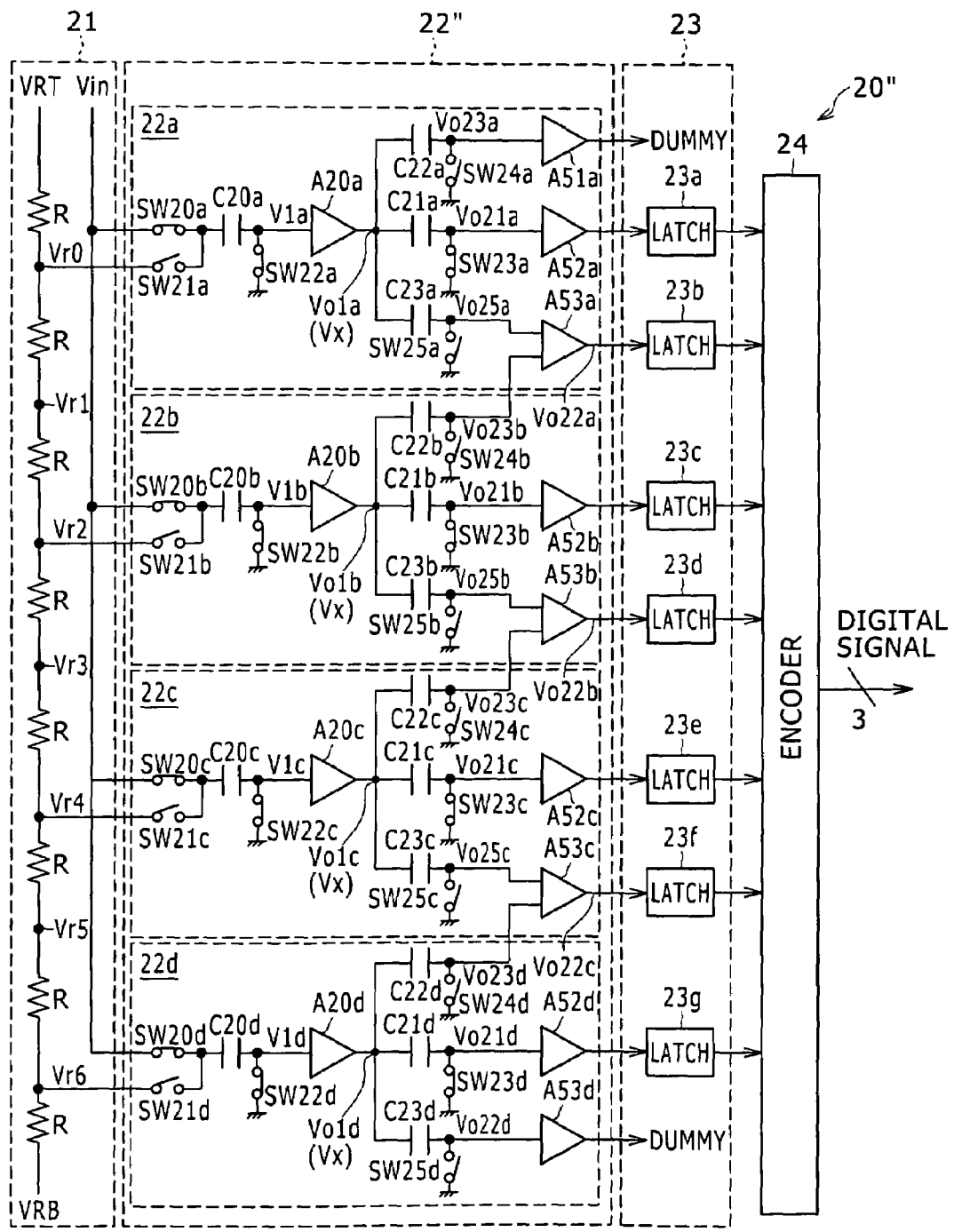
FIG. 8 is a circuit diagram of a current interpolation parallel type analog-to-digital conversion circuit of a single input type according to an embodiment of the present invention.

Next, a description will be given with respect to an interpolation parallel type analog-to-digital conversion circuit configured by using a current interpolation technique as the interpolation technique with reference to FIG. 8. FIG. 8 is a circuit diagram showing a configuration of a current interpolation parallel type analog-to-digital conversion circuit 20".

Figure 9:
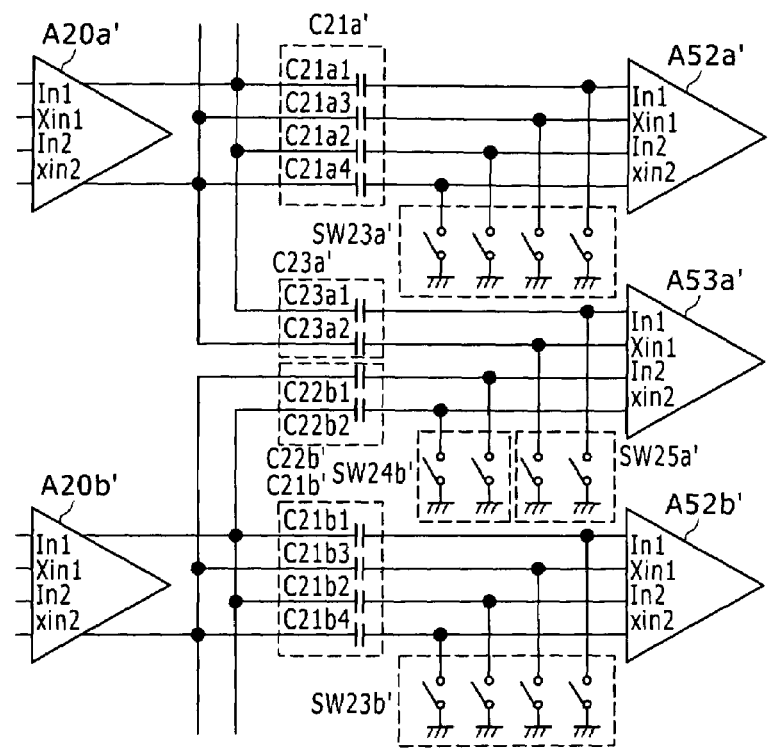
FIG. 9 is a circuit diagram of a current interpolation parallel type analog-to-digital conversion circuit of a differential input type according to an embodiment of the present invention.

As shown in FIG. 8, in the interpolation parallel type analog-to-digital conversion circuit 20" using the current interpolation technique, capacitors C23a to C23c and capacitors C22b to C22d in the adjacent comparison amplification circuits (the comparison amplification circuits 22a and 22b, 22b and 22c, and 22c and 22d) to which the reference signals close in voltage level difference to each other are inputted, respectively, are connected to amplifiers A53a to A53c, respectively, thereby configuring the current interpolation circuit. Also, output signals Vo22a to Vo22c are outputted which are obtained by performing the interpolation between the output signals Vo21a and Vo21b, between the output signal Vo21b and Vo21c, and between the output signals Vo21c and Vo21d. Note that, FIG. 9 shows an example in the case where the interpolation parallel type analog-to-digital conversion circuit is not of the single input type, but of the differential input type. Amplifiers A20a', A20b', A52b', A52b' and A53a' shown in FIG. 9 correspond to the amplifiers A20a, A20b, A52b, A52b and A53a shown in FIG. 8, respectively.

Figure 10:
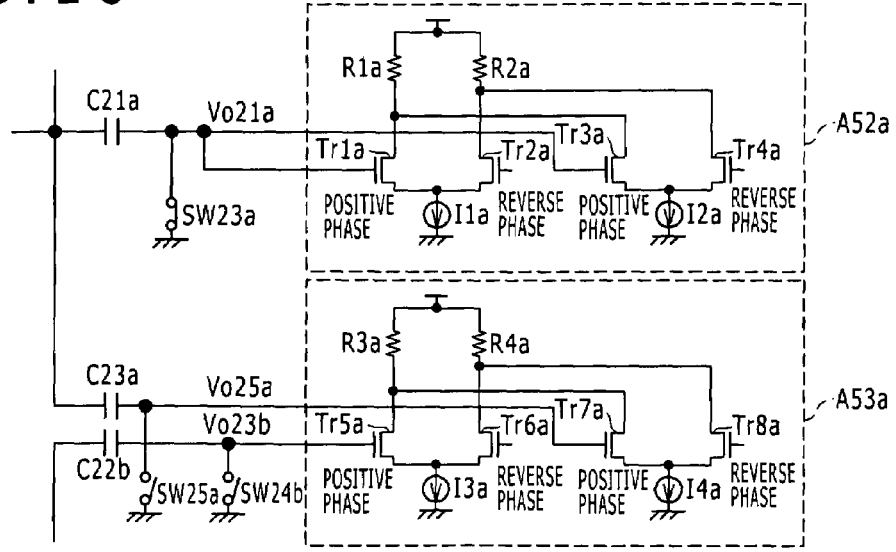
FIG. 10 is a circuit diagram showing a configuration of an amplifier in the current interpolation parallel type analog-to-digital conversion circuit shown in FIG. 8.
Figure 11:
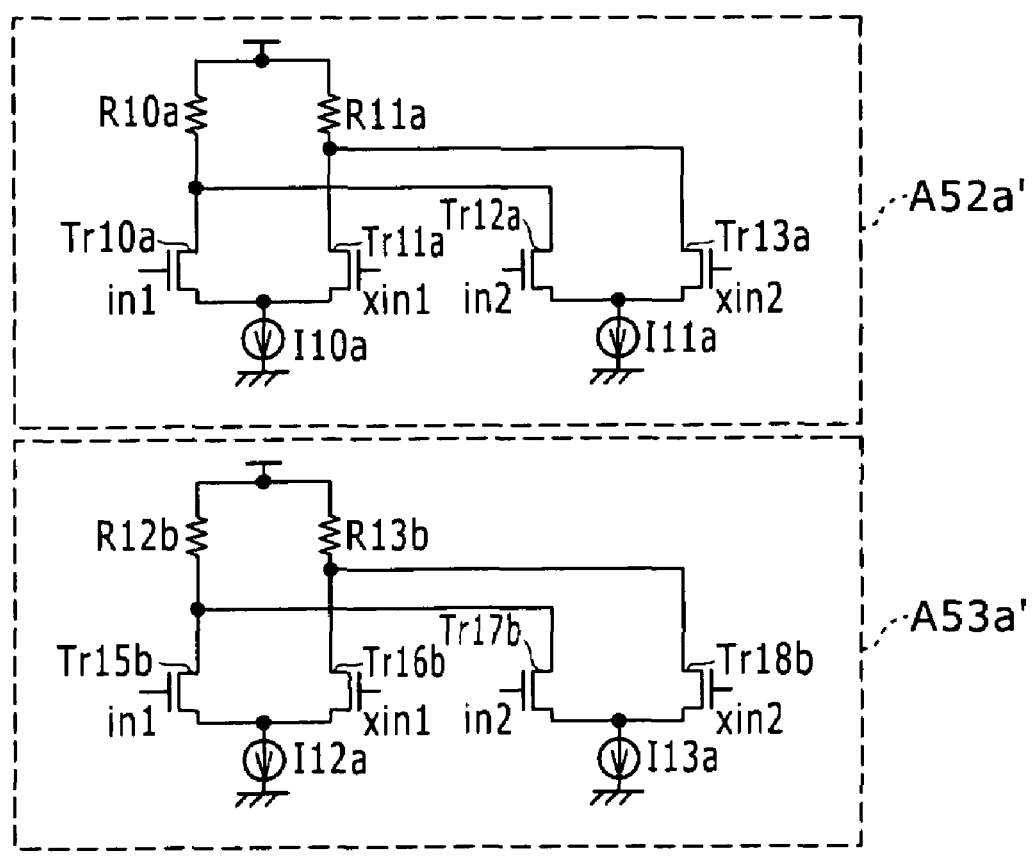
FIG. 11 is a circuit diagram showing a configuration of an amplifier in the current interpolation parallel type analog-to-digital conversion circuit shown in FIG. 9.

In the amplifier A53a for performing the current interpolation, as shown in FIG. 10, two differential pairs of MOS transistors Tr5a and Tr6a, and Tr7a and Tr8a are connected to common load resistors R3a and R4a. In addition, current sources I3a and I4a are connected to each of sources of the differential pair of MOS transistors Tr5a and Tr6a, and each of sources of the differential pair of MOS transistors Tr7a and Tr8a, respectively. Also, a capacitor C23a is connected to a gate of the MOS transistor Tr7a constituting the differential pair of MOS transistors Tr7a and Tr8a, and an output signal Vo25a is inputted to the gate of the MOS transistor Tr7a. Also, a capacitor C22b is connected to a gate of the MOS transistor Tr5a constituting the differential pair of MOS transistors Tr5a and Tr6a, and an output signal Vo23b is inputted to the gate of the MOS transistor Tr5a. It is noted that the amplifiers A51a, A52a to A52d, and A53b to A53d have the same configuration as that of the amplifier A53a. Note that, FIG. 11 shows an example in the case where the interpolation type analog-to-digital conversion circuit is not of the single input type, but of the differential input type. Thus, in the current interpolation, the adjacent amplifiers A20a to A20d can be prevented from exerting an influence on one another because of the connection made through the transistors.

Here, although in the foregoing, the interpolation parallel type analog-to-digital conversion circuit to which the capacitive interpolation or the current interpolation is applied has been described as the example, the present embodiment can also be applied to an interpolation parallel type analog-to-digital conversion circuit to which the resistive interpolation or the like is applied. It is noted that although another configuration of the interpolation parallel type analog-to-digital conversion circuit will be concretely described hereinafter by giving the interpolation parallel type analog-to-digital conversion circuit to which the resistive interpolation is applied as an example, the present embodiment can also be applied to the interpolation parallel type analog-to-digital conversion circuit configured by using the current interpolation technique or the resistive interpolation technique.

In the interpolation parallel type analog-to-digital conversion circuit described above, the seven latch circuits 23a to 23g are provided. However, the output signals Vo21a to Vo21d are outputted in the first phase, and the output signals Vo22a to Vo22d are outputted in the second phase. Thus, for example, as in a capacitive interpolation parallel type analog-to-digital conversion circuit 60 shown in FIG. 12, output signals Vo21a to Vo21d may be latched in the first phase by four latch circuits 23a, 23c, 23e, and 23g, respectively, and output signals Vo22a to Vo22c may be latched in the second phase by the latches 23a, 23c and 23e, respectively. That is to say, in this case, the output signals Vo21a to Vo21d, and the output signals Vo22a to Vo22c are latched in a time division manner.

Figure 12:
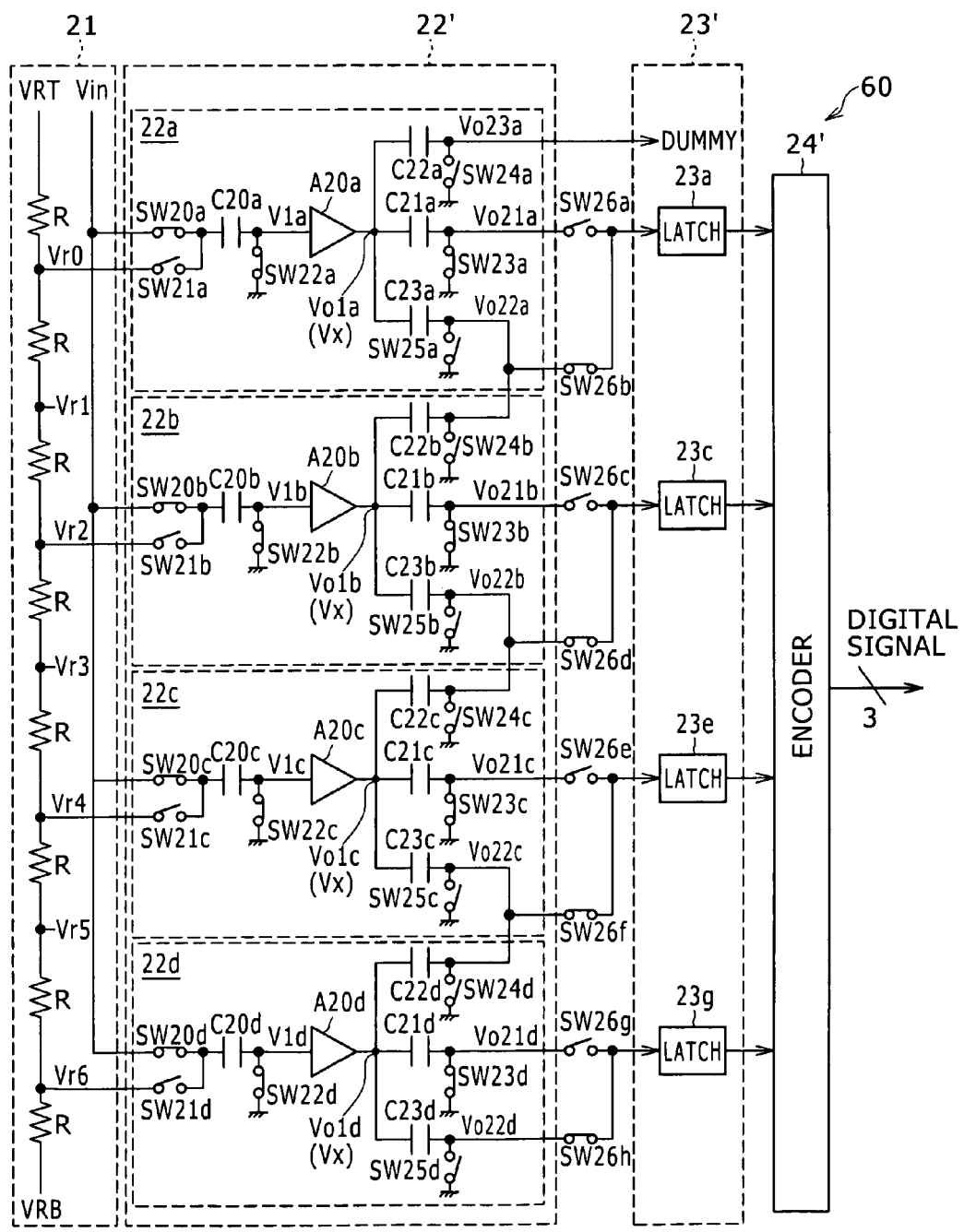
FIG. 12 is a circuit diagram showing a configuration of a capacitive interpolation parallel type analog-to-digital conversion circuit according to an embodiment of the present invention.
Figure 13:
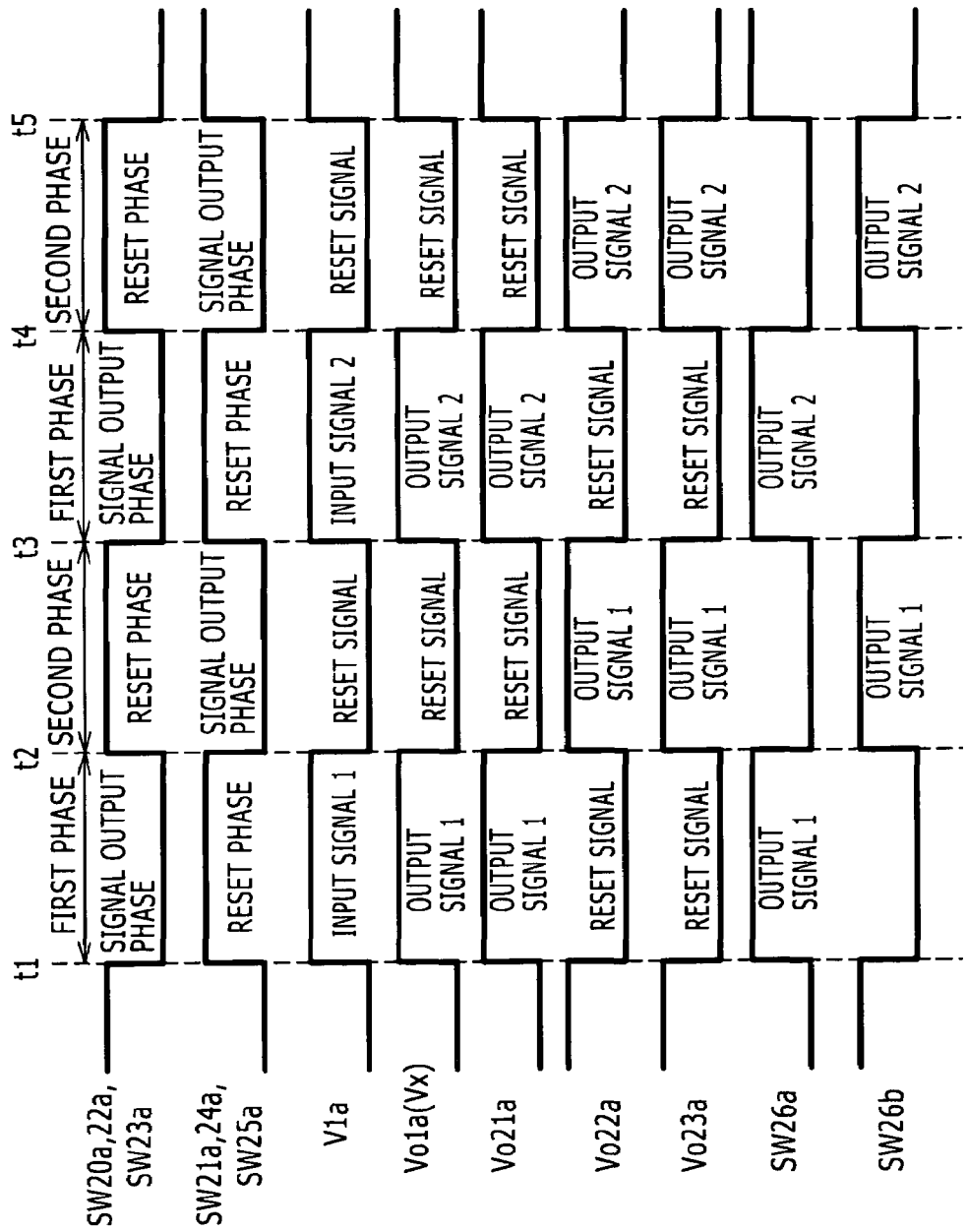
FIG. 13 is a timing chart explaining an internal operation of the capacitive interpolation parallel type analog-to-digital conversion circuit according to the embodiment of the present invention.

As shown in FIG. 12, in the capacitive interpolation parallel type analog-to-digital conversion circuit 60, the capacitors C21a to C21d are connected to the latch circuits 23a, 23c, 23e and 23g through switches SW26a, SW26c, SW26e, and SW26g as output selection switches, respectively. Also, the capacitors C23a to C23d (the capacitors C22b to C22d) are connected to the latch circuits 23a, 23c, 23e, and 23g through switches SW26b, SW26d, SW26f, and SW26h, respectively. As a result, as shown in FIG. 13, each of the switches SW26a, SW26c, SW26e, and SW26g, and each of the switches SW26b, SW26d, SW26f, and SW26h are alternately held in the ON state. It is noted that FIG. 13 is a timing chart showing timings in the operations of the portions associated with the switches SW26a and SW26b, and these timings in the operations of the portions associated therewith also apply to other switches SW26c to SW26h.

Also, in the first phase, each of the SW26a, SW26c, SW26e, and SW26g is held in the ON state, which results in that the output signals Vo21a to Vo21d outputted through the capacitors C21a to C21d are inputted to the latch circuits 23a, 23c, 23e, and 23g to be latched therein, respectively (refer to FIG. 13). An encoder 24' refers to the latch states in the latch circuits 23a, 23c, 23e, and 23g at this time.

In addition, in the second phase, each of the SW26b, SW26d, SW26f, and SW26h is held in the ON state, which results in that the output signals Vo22a to Vo22d outputted through the capacitors C23a to C23d are outputted to the latch circuits 23a, 23c, 23e, and 23g to be latched therein, respectively (refer to FIG. 13). An encoder 24' refers to the latch states in the latch circuits 23a, 23c, 23e, and 23g at this time.

Also, the encoder 24' outputs a digital signal corresponding to the input signal Vin based on the latch states in the latch circuits 23a, 23c, 23e, and 23g in the first phase and the second phase. For example, when in the first phase, the latch states in the latch circuits 23a, 23c, 23e, and 23g are "0(L level)", "1(H level)", "1(H level)", and "1(H level)", and in the second phase, the latch states in the latch circuits 23a, 23c, 23e, and 23g are "0(L level)", "1(H level)", "1(H level)", and "1(H level)", the encoder 241 outputs the digital signal having a value of "101".

Figure 14:
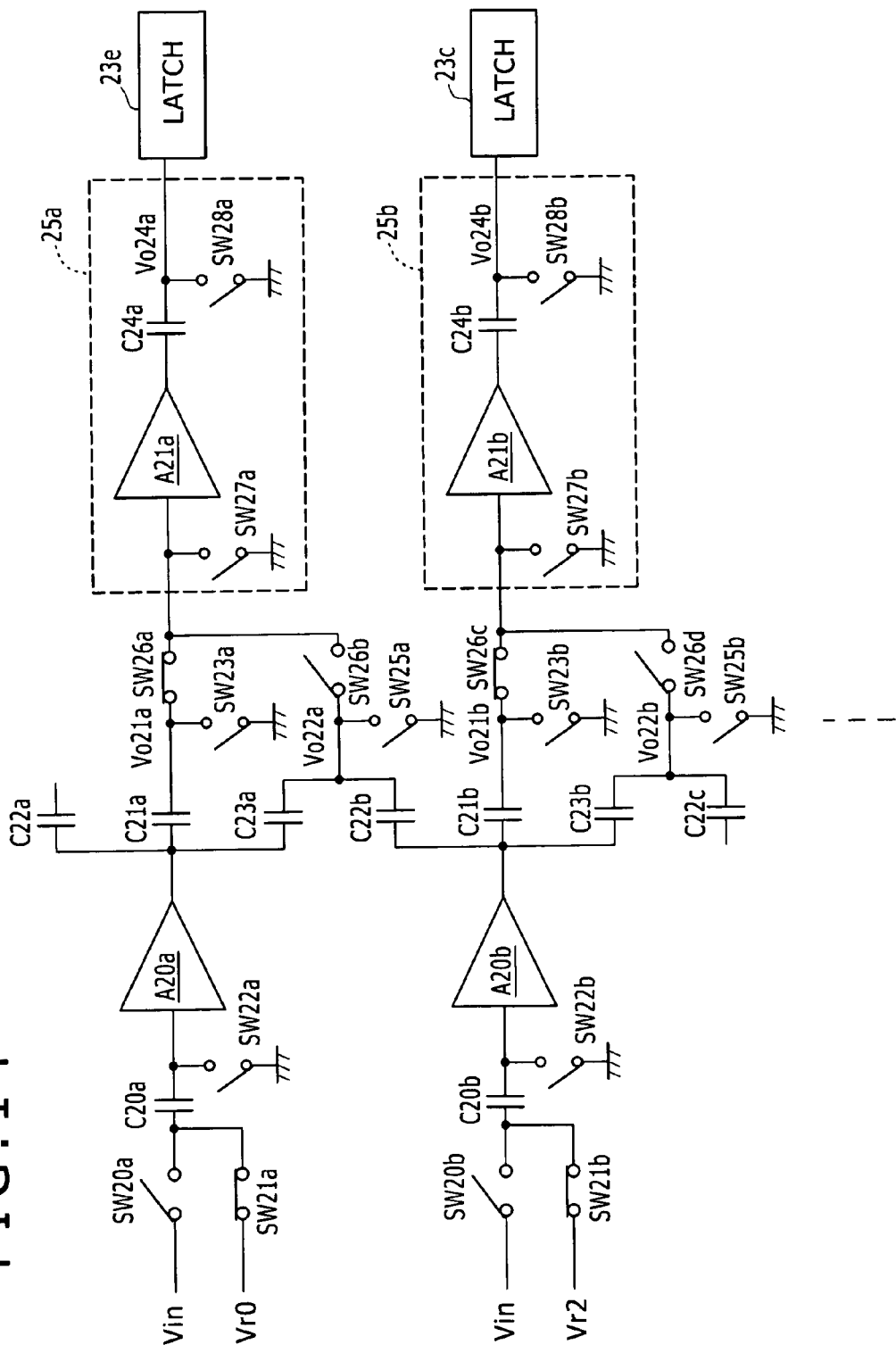
FIG. 14 is a circuit diagram showing a configuration of a part of the capacitive interpolation parallel type analog-to-digital conversion circuit shown in FOG. 13.
Figure 15:
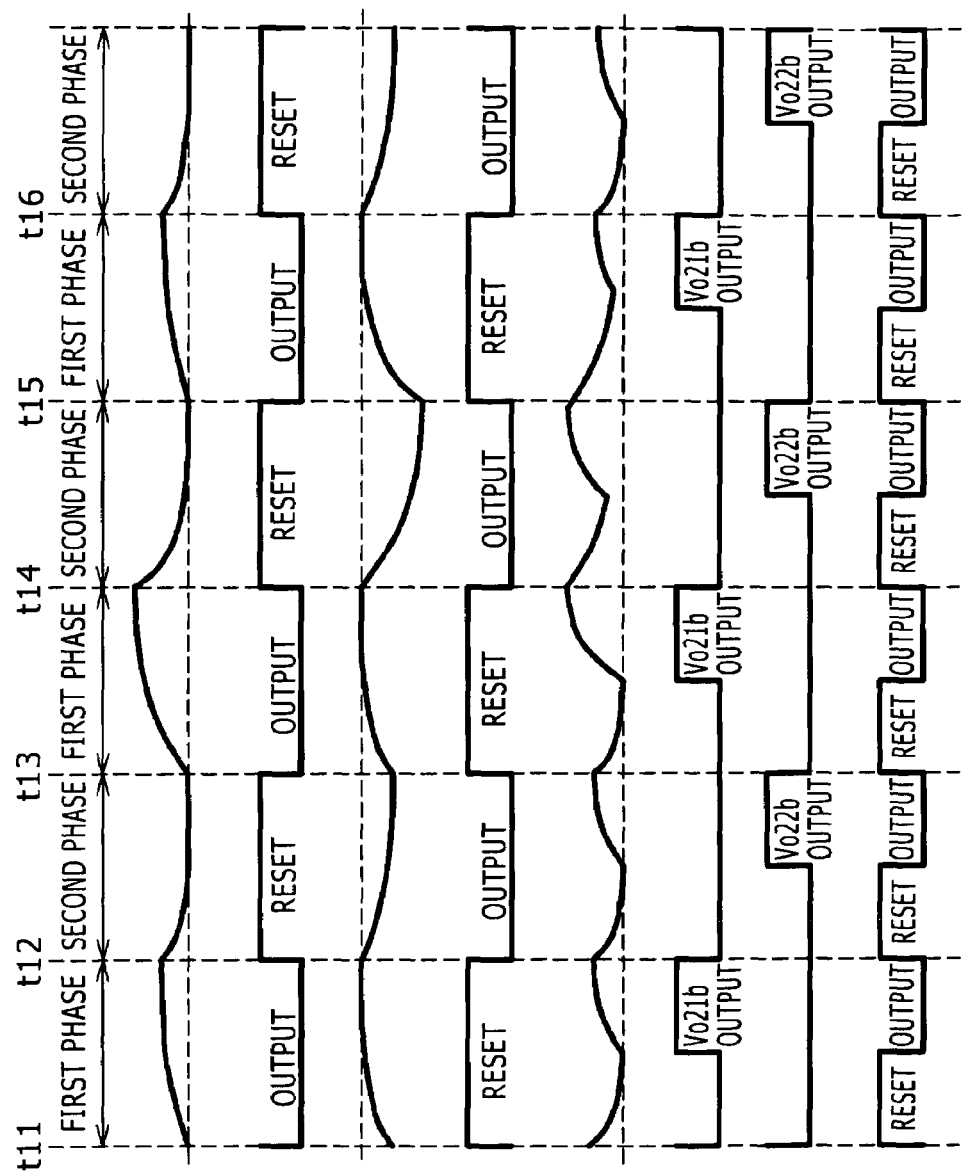
FIGS. 15A to 15H are a timing chart explaining an internal operation of the capacitive interpolation parallel type analog-to-digital conversion circuit shown in FIG. 13.

Now, when sufficient amplification factors are not sufficiently obtained in the amplifiers A20a to A20d in the capacitive interpolation parallel type analog-to-digital conversion circuit 60, amplification portions 25a to 25d are provided between the switches SW26a and SW26b, SW26c and SW26d, SW26e and SW26f, and SW26g and SW26h, and the latch circuits 23a, 23c, 23e, and 23g, respectively. FIG. 14 shows a configuration in which the amplification portion 25a is provided between the switches SW26a and SW26b, and the latch circuit 23a, and the amplification portion 25b is provided between the switches SW26c and SW26d, and the latch circuit 23c. It is noted that the amplification portions 25c and 25d has the same configuration as that of the amplification portions 25a and 25b, and thus an illustration thereof is omitted here for the sake of simplicity.

The amplification portions 25a to 25d include amplifiers A21a to A21d, capacitors C24a to C24d for canceling the offset voltages of the amplifiers A21a to A21d, respectively, and switches SW27a to SW27d, and SW28a to SW28d as resetting switches, respectively.

In these amplification portions 25a to 25d, in the first phase, the output signals Vo21a to Vo21d are amplified and outputted, and in the second phase, the output signals Vo22a to Vo22d are amplified and outputted. For this reason, the amplification operation and the resetting operation (the operation for canceling the offset voltages of the amplifiers A21a to A21d) need to be repeatedly carried out in the first phase and in the second phase. Therefore, each of the amplification portions 25a to 25d must be operated with an operating cycle which is double that of each of the amplifiers A20a to A20d.

However, the capacitive interpolation parallel type analog-to-digital conversion circuit 60 is operated at a high speed, which leads to that the reset operation for the amplifiers A21a to A21d can not be sufficiently carried out.

For example, giving a description by giving an operation of the amplifier 25b as an example, as shown in FIGS. 15A to 15H, at a timing t11 to t14, the output signal Vo21b (refer to FIG. 15A) inputted in the first phase can be amplified in a state in which the output signals Vo24b from the amplifier A21b is reset by resetting the amplifier A21b (by turning ON each of the switches SW27b and SW28b). However, at a timing from t14 to t16, the output signal Vo21b is amplified without being able to sufficiently reset the output signal Vo24b (refer to FIG. 15E) from the amplifier A21b by resetting the amplifier A21b. For this reason, there is the possibility that a false digital signal outputted from the encoder 24' because the right information can not be acquired in the latch circuit 23c. This also applies to each of the latch circuits 23a, 23e and 23g.

In order to cope with such a situation, in the capacitive interpolation parallel type analog-to-digital conversion circuit 60 of this embodiment, one amplification portion to be operated of the amplification portions 25a to 25d is determined in accordance with the level of the input signal Vin acquired and detected through the latch circuits 23a, 23c, 23e, and 23g in the first phase, and other amplification portions are inhibited from being operated. As a result, the encoder 24' is prevented from acquiring the wrong information from the latch circuits 23a, 23c, 23e, and 23g. That is to say, the input signal to the amplification portion which needs to be detected in the second phase in accordance with the results in the first phase has a small amplitude. On the other hand, the input signals to other amplification portions have large amplitudes. Thus, other amplification portions are inhibited from being operated, which results in that the state is avoided in which each of other amplification portions concerned sufficiently get the reset state.

Figure 16:
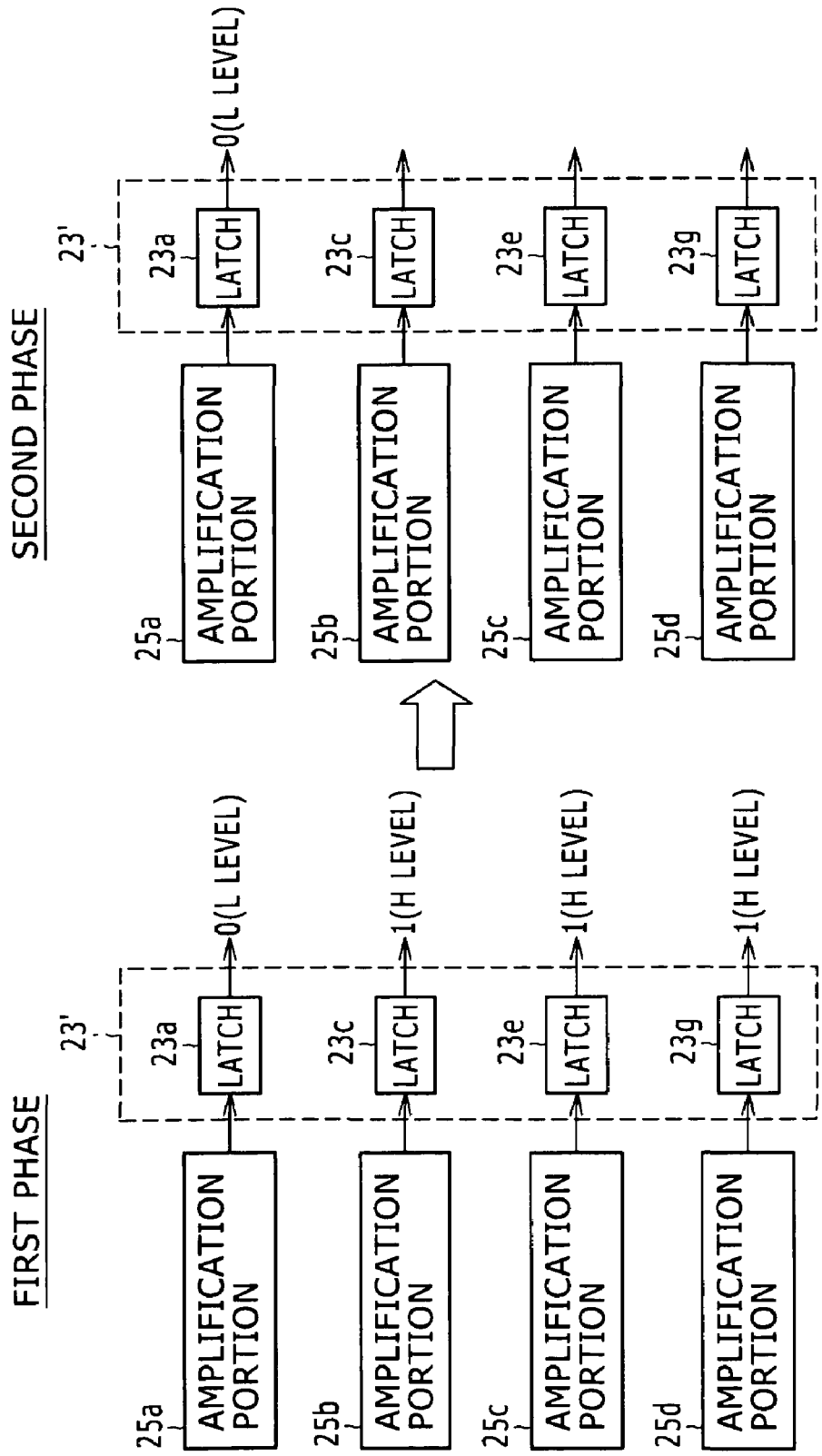
FIGS. 16A and 16B are respectively block diagrams explaining operation stop control for an amplification portion and a latch circuit of the capacitive interpolation parallel type analog-to-digital conversion circuit shown in FIG. 13.
Figure 17:
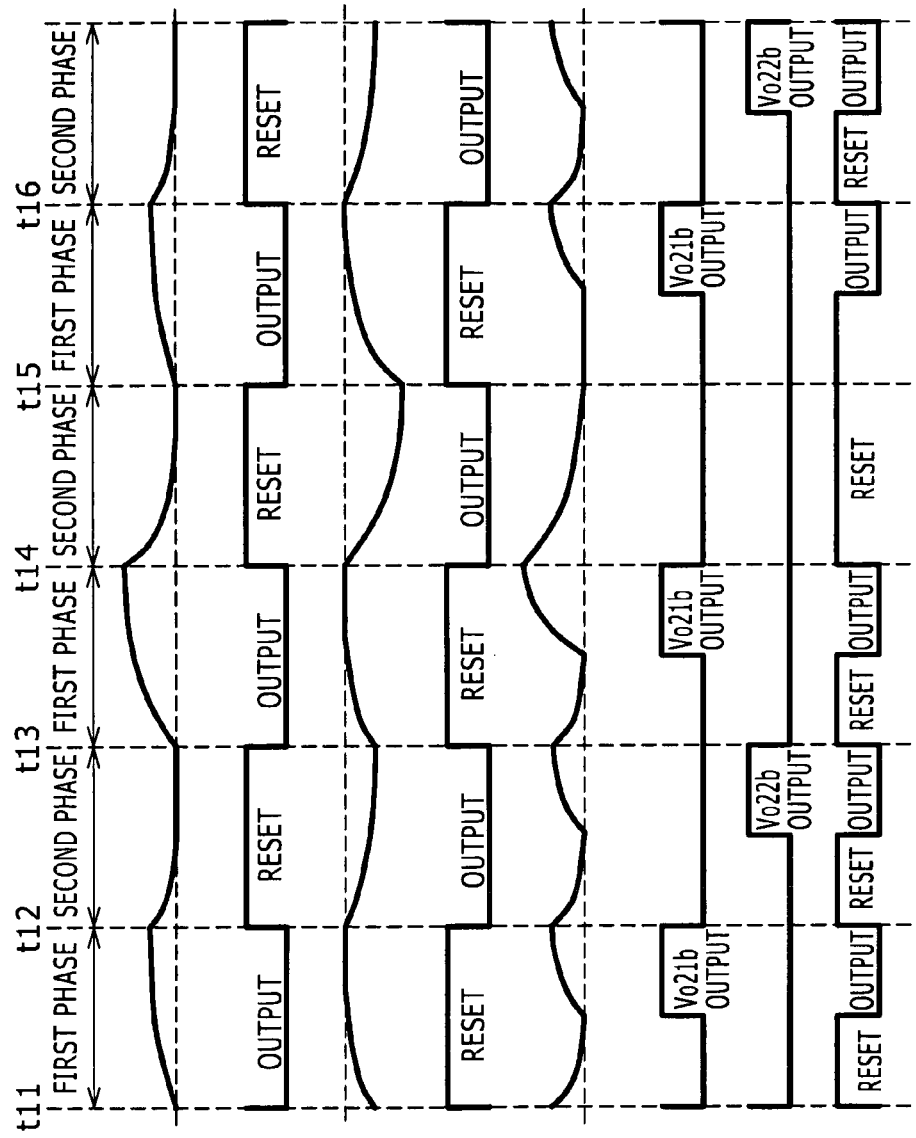
FIGS. 17A to 17H are a timing chart explaining the operation stop control for the amplification portion of the capacitive interpolation parallel type analog-to-digital conversion circuit shown in FIG. 13.

For example, when in the first phase, the latch circuits 23a, 23c, 23e, and 23g are held in "0(L level)", "1(H level)", "1(H level)", and "1(H level)", respectively, as shown in FIG. 16A, the digital signal to be outputted from the encoder 24' becomes either "101" or "110". Therefore, in the second phase, it has to be detected whether the output signal from the amplifier 25a is held in "0(L level)" or in "1(H level)". Also, the digital signal which becomes "101" when the output signal from the amplification portion 25a is held in the "0(L level)" in the second phase is outputted from the encoder 24'. On the other hand, the digital signal which becomes "110" when the output signal from the amplification portion 25a is held in the "1(H level)" in the second phase is outputted from the encoder 24'.

Then, in the second phase, the operations of the amplification portions 25b to 25d and the latch circuits 23c, 23e and 23g except for the amplification portion 25a and the latch circuit 23a are stopped as shown in FIG. 16B. As a result, each of the amplification portions 25b to 25d can be set in the reset state for the time period in the second phase. Thus, even when the latch circuits 23b, 23d and 23f shown in FIG. 7 are removed, the capacitive interpolation parallel type analog-to-digital conversion circuit 60 can be operated at a high speed. For example, as shown in FIGS. 17A to 17H, a time period from t14 to t15 is set as a reset time period (refer to FIG. 17H) in the amplification portion 25b, which results in that the reset time period can be made treble an output time period. As a result, the reset state can be sufficiently obtained.

Here, the operations of the amplification portions 25b to 25d are stopped by, for example, turning ON the switches SW27b to SW27d. In addition, the operations of the latch circuits 23c, 23e and 23g are stopped by, for example, inputting the reset signal to each of the latch circuits 23c, 23e and 23g. Also, the encoder 24' detects only the latch state of the latch circuit 23a held in the operation state. In the manner as described above, the latch circuits 23c, 23e and 23g are reset in the second phase to stop in their operations, thereby making it possible to reduce the power consumption.

As described above, in each of the capacitive interpolation parallel type analog-to-digital conversion circuits 20 and 20' of these embodiments, the signal corresponding to the voltage difference between the input voltage Vin and the reference signal Vr in the first phase and the signal corresponding to the voltage difference between the input voltage Vin and the reference signal Vr in the second phase can be outputted from the comparison amplification circuits 22a to 22d. Therefore, it is possible to provide the parallel type analog-to-digital conversion circuit in which the capacitive interpolation is performed by using the signals, corresponding to the voltage differences, outputted in the first phase and the signals, respectively, to reduce the number of amplifiers, thereby making it possible to realize the low power consumption and the small area. It is noted that in addition to the capacitive interpolation, the resistive interpolation, the current interpolation or the like can be performed by using the signals, corresponding to the voltage differences, outputted in the first phase and the signals, respectively.

It is noted that each of the switches described above is composed of a MOS transistor or the like. In addition, those switches are controlled in accordance with control signals issued from a control portion (not shown). For example, in the case of the capacitive interpolation parallel type analog-to-digital conversion circuit 60 shown in FIG. 12, each of the switches SW20a to SW20d, SW22a to SW22d, SW23a to SW23d, SW26b, SW26d, SW26f, and SW26h is controlled in accordance with a first control signal. Also, each of the switches SW21a to SW21d, SW24a to SW24d, SW25a to SW25d, SW26a, SW26c, SW26e, and SW26g is controlled in accordance with a second control signal as an inverted signal of the first control signal.

Although the embodiments of the present invention have been described in detail with reference to the accompanying drawings, they are merely illustrations, and thus the present embodiment can be implemented in the form of other illustrative embodiments for which various changes and improvements are made based on the knowledge of those skilled in the art.

Figure 18:
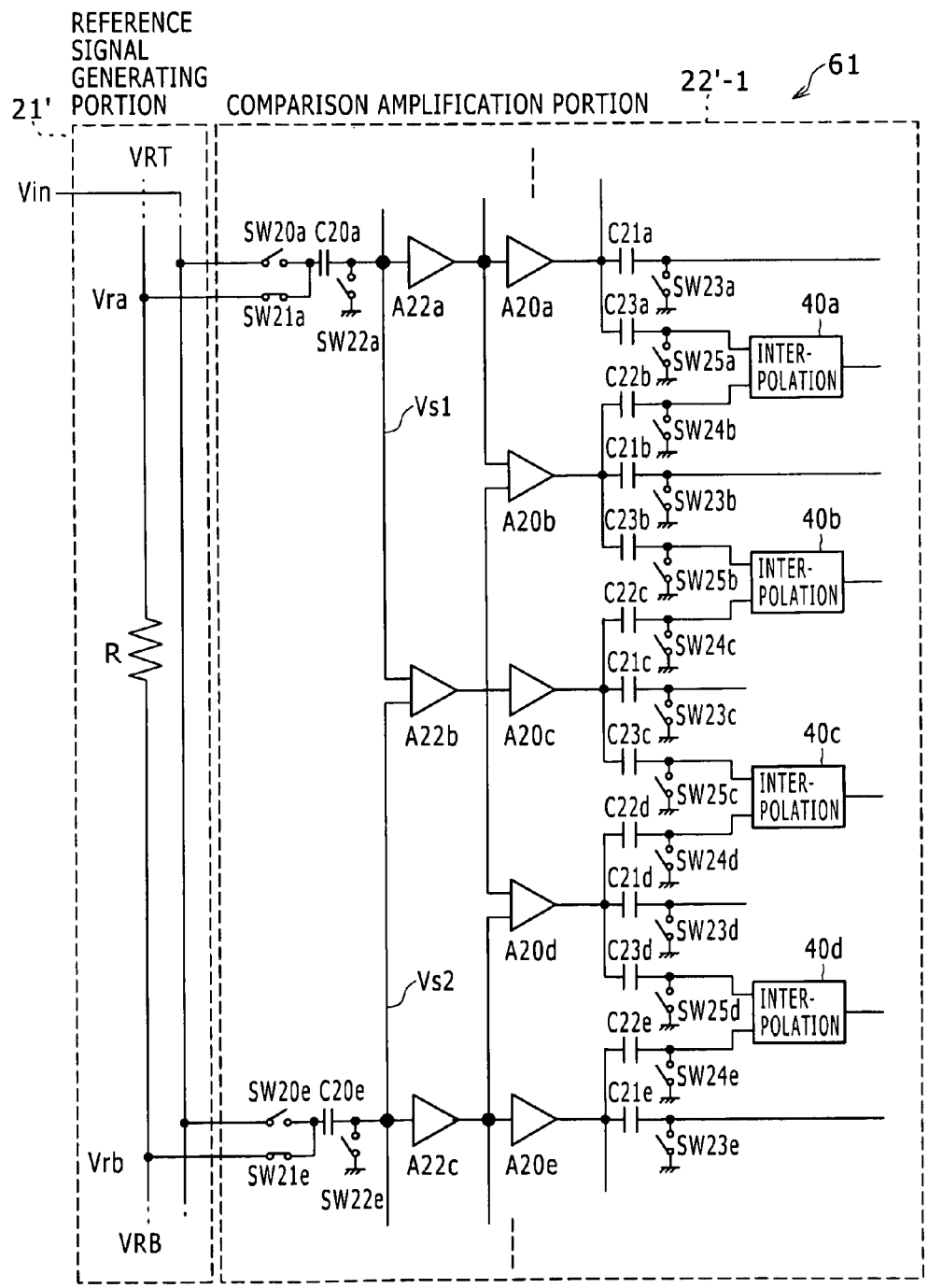
FIG. 18 is a circuit diagram showing a configuration of a capacitive interpolation parallel type analog-to-digital conversion circuit according to another embodiment of the present invention.
Figure 19A:
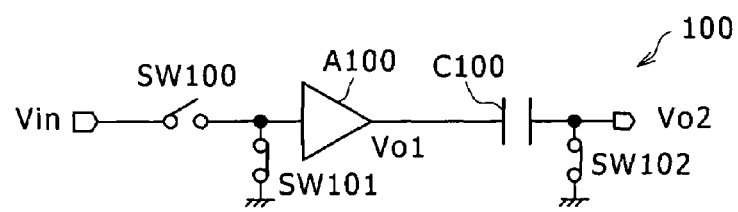
FIGS. 19A and 19B are respectively a circuit diagram showing a configuration of a sampling circuit in the related art, and a timing chart showing an interpolation operation of the sampling circuit in the related art.
Figure 19B:
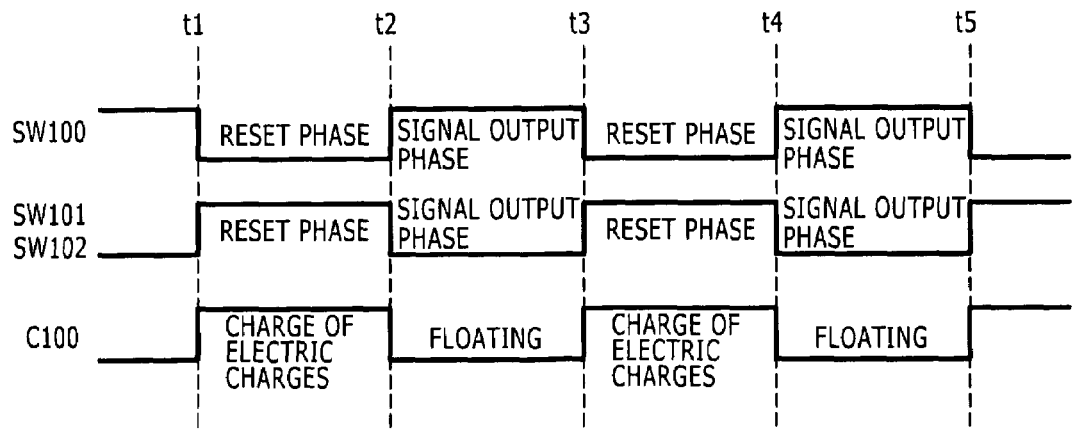
Figure 20A:
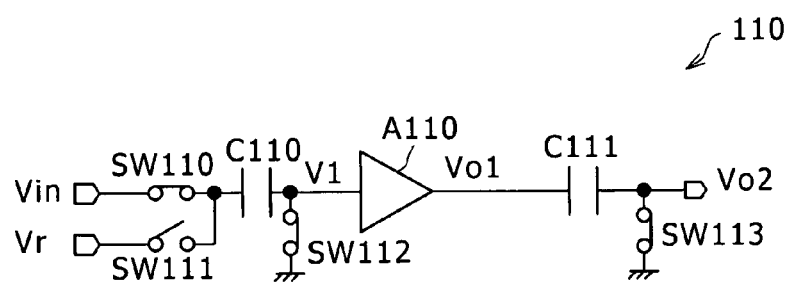
FIGS. 20A and 20B are respectively a circuit diagram showing a configuration of a comparison amplification circuit in the related art, and a timing chart showing an interpolation operation of the comparison amplification in the related art.
Figure 20B:
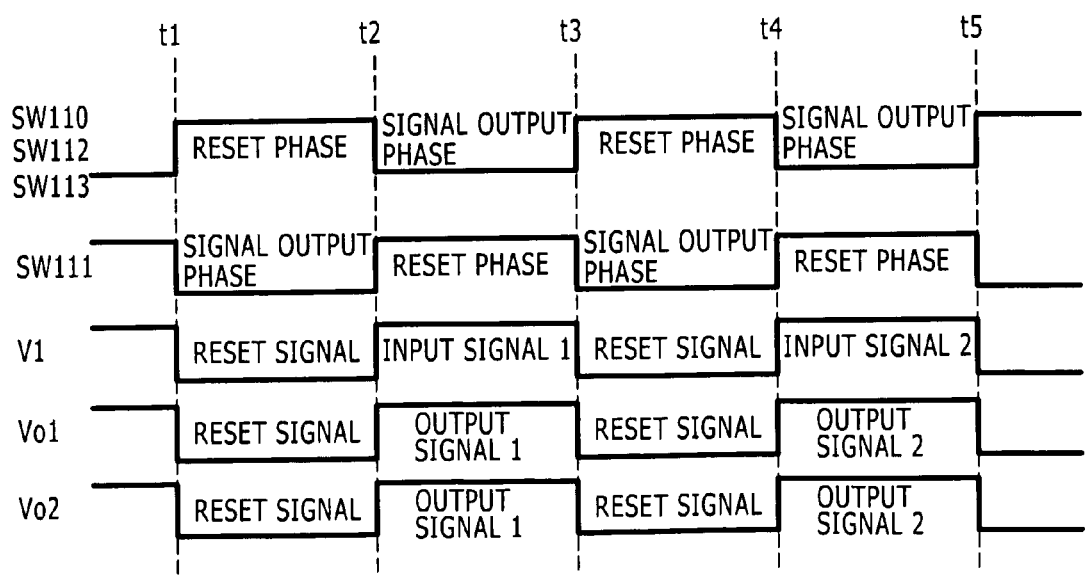
Figure 21:
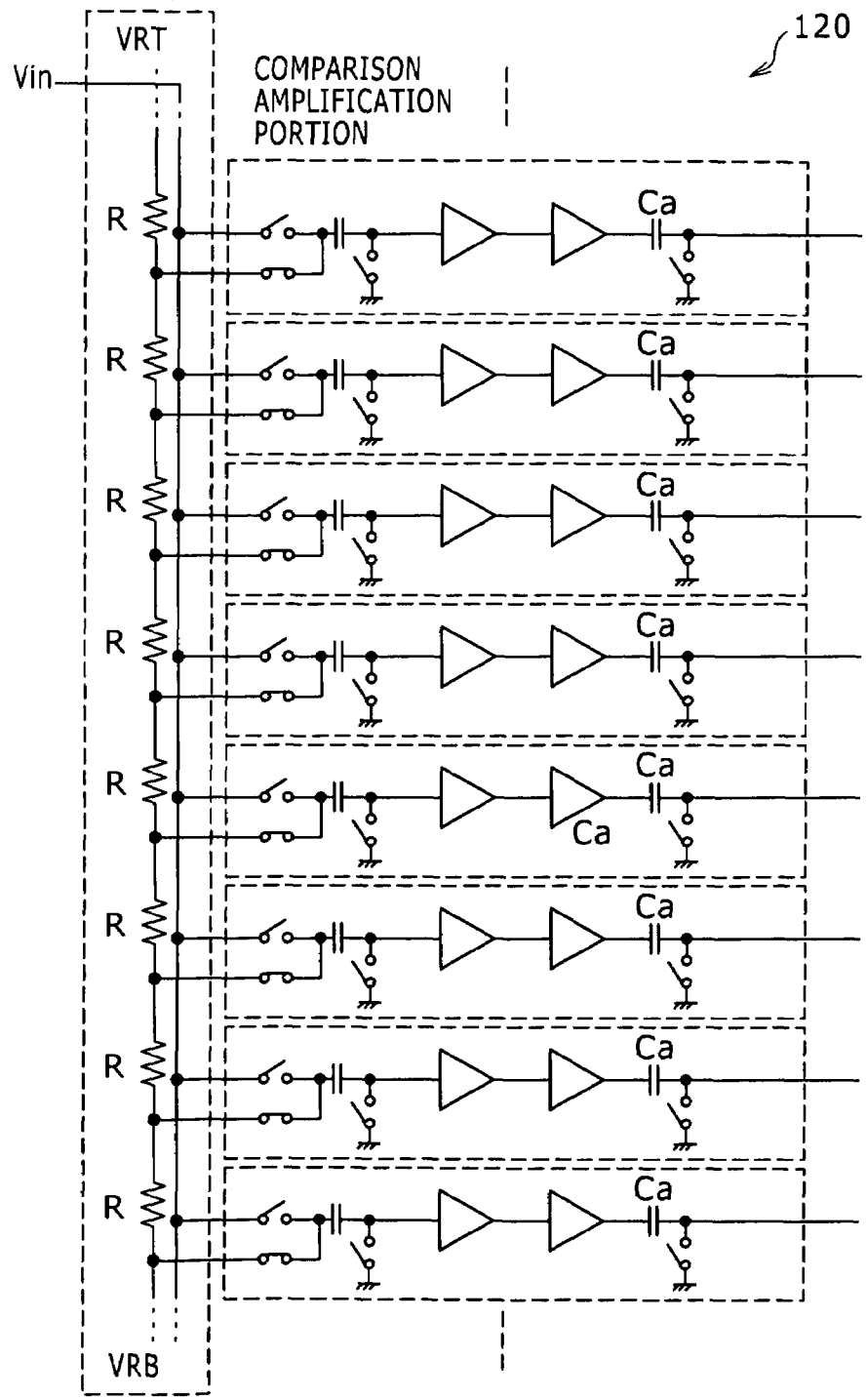
FIG. 21 is a circuit diagram showing a configuration of a parallel type analog-to-digital conversion circuit in the related art.
Figure 22:
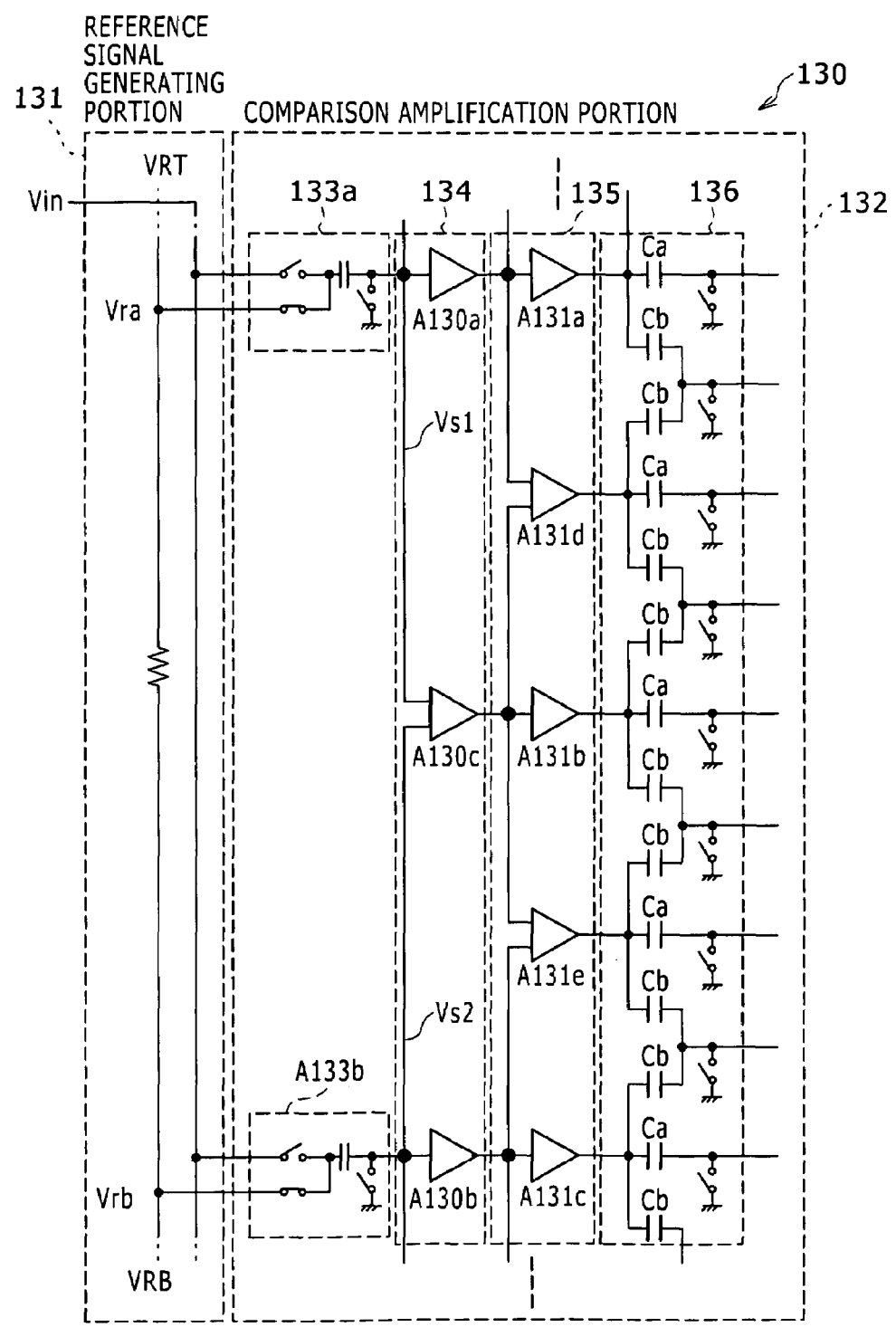
FIG. 22 is a circuit diagram showing a configuration of an interpolation parallel type analog-to-digital conversion circuit using a capacitive interpolation technique in the related art.

For example, similarly to the case of the interpolation parallel type analog-to-digital conversion circuit 130 as shown in FIG. 22, as shown in FIG. 18, the output signals from amplifiers A20a to A20e may be capacitively interpolated as follows in a capacitive interpolation parallel type analog-to-digital conversion circuit 61. That is to say, voltage differences Vs1 and Vs2 and an intermediate voltage thereof are amplified in amplifiers A22a to A22c in a preceding stage, and these voltage differences and the intermediate voltage between them thus amplified are amplified in amplifiers A20a to A20e, respectively, in a subsequent stage. In such a manner, the capacitive interpolation is carried out.

It should be understood by those skilled in the art that various modifications, combinations, sub-combinations and alterations may occur depending on design requirements and other factors insofar as they are within the scope of the appended claims or the equivalents thereof.

What is claimed is:

1. A parallel type analog-to-digital conversion circuit, comprising:

a reference signal generating portion for generating a plurality of reference signals different in voltage from one another; and a comparison amplification portion for amplifying voltage differences between the plurality of reference signals generated by said reference signal generating portion, and an input signal, and outputting the voltage differences thus amplified;

said comparison amplification portion including
a plurality of amplifiers,
input resetting switches connected to input terminals of said plurality of amplifiers, respectively, and adapted to make an input signal to each of said plurality of amplifiers invalid, first sampling capacitors including one terminals connected to output terminals of said plurality of amplifiers, respectively, second sampling capacitors including one terminals connected to the output terminals of said plurality of amplifiers, respectively, first sampling switches provided between the other terminals of said first sampling capacitors, and a portion including a predetermined potential, and second sampling switches provided between the other terminals of said second sampling capacitors, and a portion including the predetermined potential, wherein a control operation for holding each of said input resetting switches and said first sampling switches in an ON state for a given time period, and a control operation for holding each of said second sampling switches in an ON state for a given time period are carried out alternately, so that signals corresponding to the voltage differences between the input signal and the reference signals are outputted alternately through said first sampling capacitors and through said second sampling capacitors.

2. The parallel type analog-to-digital conversion circuit according to claim 1, wherein said comparison amplification portion is provided with an interpolation circuit for interpolating output signals outputted from each two different amplifiers through corresponding ones of said second sampling capacitors.

3. The parallel type analog-to-digital conversion circuit according to claim 1, wherein said comparison amplification portion includes:

capacitors for comparison including one terminals connected to said input terminals of said amplifiers, respectively;

switches for an input signal including one terminals connected to the other terminals of said capacitors for comparison, respectively, for inputting the input signal to said amplifiers;

switches for reference signals including one terminals connected to the other terminals of said capacitors for comparison, respectively, for inputting the reference signals to said amplifiers, respectively; and when said input resetting switches are turned ON, ones of said switches for an input signal and said switches for reference signals are turned ON, and when said input resetting switches are turned OFF, the others of said switches for an input signal and said switches for reference signals are turned ON.

4. The parallel type analog-to-digital conversion circuit according to claim 1, further comprising:

a plurality of output selection switches including one terminals connected to output terminals of said comparison amplification portion, respectively;

a plurality of latch circuits each being connected to each two different output terminals of said comparison amplification portions through corresponding ones of said plurality of output selection switches; and an encoder for encoding a digital signal corresponding to the input signal in accordance with latch states of said plurality of latch circuits;

wherein each two output selection switches including one terminals connected to the corresponding ones of said plurality of latch circuits are alternately turned ON synchronously with operations of said sampling switches, and each two output signals from said comparison amplification portion are latched in corresponding ones of said plurality of latch circuits, respectively, in a time division manner.

5. The parallel type analog-to-digital conversion circuit according to claim 4, wherein amplification portions are provided between said output selection switches and said latch circuits, respectively; and when the other sampling switches are turned ON in accordance with latch states of said plurality of latch circuits when ones of said first sampling switches and said second sampling switches are turned ON, an operation of a part of said plurality of amplification portions is stopped.

6. The parallel type analog-to-digital conversion circuit according to claim 5, wherein when the operation of the part of said plurality of amplification portions is stopped, an operation of a part of said plurality of latch circuits is stopped.

7. A sampling circuit, comprising:

an amplifier for amplifying an input signal;

an input resetting switch including one terminal connected to an input terminal of said amplifier and adapted to make the input signal to said amplifier invalid;

a plurality of capacitors including one terminals each being connected to an output terminal of said amplifier; and a plurality of sampling switches provided between the other terminals of said plurality of capacitors, and portions each including a predetermined potential, respectively;

wherein after said input resetting switch and one or more sampling switches of said plurality of sampling switches are each held in an ON state for a given time period, the remaining one(s) of said plurality of sampling switches is (are) turned ON for a given time period, so that signals each corresponding to the input signal are outputted alternately through the other terminals of one or more capacitors of said plurality of capacitors, and the other terminal(s) of the remaining capacitor(s).

8. A comparison amplification circuit for outputting a signal corresponding to a voltage difference between an input signal and a reference signal, comprising:

an amplifier;

a capacitor for comparison including one terminal connected to an input terminal of said amplifier;

a switch for an input signal including one terminal connected to the other terminal of said capacitor for comparison for inputting the input signal to said amplifier;

a switch for a reference signal including one terminal connected to the other terminal of said capacitor for comparison for inputting the reference signal to said amplifier;

an input resetting switch including one terminal connected to the input terminal of said amplifier for making an input signal to said amplifier invalid;

a plurality of sampling capacitors including one terminals each being connected to an output terminal of said amplifier; and a plurality of sampling switches provided between the other terminals of said plurality of sampling capacitors, and portions each including a predetermined potential, respectively;

wherein each of said switch for an input signal and said input resetting switch, and said switch for a reference signal are alternately turned ON, each of one or more switches of said plurality of sampling switches, and the remaining switch(es) are alternately turned ON synchronously with operations of each of said switch for an input signal and said input resetting switch, and said switch for a reference signal, and a signal corresponding to a voltage difference between the input signal and the reference signal is outputted alternately through each of one or more switches of said plurality of sampling switches, and the remaining switch(es).

* * * * *